United States Patent [19]

Kawasaki et al.

[11] Patent Number: 5,220,201

[45] Date of Patent: Jun. 15, 1993

[54] PHASE-LOCKED SIGNAL GENERATOR

[75] Inventors: Somei Kawasaki, Tokyo; Hiroyuki Mizuno; Masami Iseki, both of Yokohama, all of Japan

[73] Assignee: Canon Kabushiki Kaisha, Tokyo, Japan

[21] Appl. No.: 718,254

[22] Filed: Jun. 20, 1991

[30] Foreign Application Priority Data

| Jun. 26, 1990 | [JP] | Japan | 2-169230 |
| Jun. 26, 1990 | [JP] | Japan | 20165615 |
| Jun. 27, 1990 | [JP] | Japan | 2-171113 |
| Jun. 29, 1990 | [JP] | Japan | 2-169945 |
| Jun. 29, 1990 | [JP] | Japan | 2-169946 |
| Dec. 10, 1990 | [JP] | Japan | 2-401072 |

[51] Int. Cl.$^5$ .................. H03K 3/017; H03K 5/13
[52] U.S. Cl. ........................ 307/269; 307/265; 328/58; 328/63; 328/74; 328/137; 328/155
[58] Field of Search ............ 307/511, 514, 262, 265, 307/269; 328/58, 63, 72, 74, 137, 155, 104, 154

[56] References Cited

U.S. PATENT DOCUMENTS

| 3,840,815 | 10/1974 | Masters | 328/58 |
| 4,214,213 | 7/1980 | Ferrie | 328/137 |
| 4,755,758 | 7/1988 | Orihashi | 328/63 |
| 4,757,264 | 7/1988 | Lee et al. | 328/63 |
| 4,796,095 | 1/1989 | Shimada | 328/63 |
| 4,970,418 | 11/1990 | Masterson | 307/265 |

Primary Examiner—Timothy P. Callahan
Attorney, Agent, or Firm—Fitzpatrick, Cella, Harper & Scinto

[57] ABSTRACT

A phase-locked signal generator for generating a clock signal phase-locked with an external input trigger signal comprises means for generating a period signal having a frequency equal to that of a clock signal to be output, means for comparing the period signal with a plurality of reference levels different from each other, memory means for storing a comparison result from the comparing means in synchronism with an input of the trigger signal, and arithmetic means for logically operating the comparison result output from the comparing means on the basis of the comparison result stored in the memory means.

19 Claims, 27 Drawing Sheets

| PHASE ZONE | PHASE DATA | | | | | RESET TIMING | | | | |
|---|---|---|---|---|---|---|---|---|---|---|
| | $D_0$ | $D_1$ | $D_2$ | $D_3$ | $D_4$ | $C_0$ | $C_1$ | $C_2$ | $C_3$ | $C_4$ |
| $Z_1$ | * | 0 | 0 | 0 | 0 | * | 1 | 1 | 1 | 1 |
| $Z_2$ | 1 | 1 | 0 | 0 | 0 | 0 | 1 | 1 | 1 | 0 |
| $Z_3$ | 1 | 1 | 1 | 0 | 0 | 0 | 1 | 1 | 0 | 0 |
| $Z_4$ | 1 | 1 | 1 | 1 | 0 | 0 | 1 | 0 | 0 | 0 |
| $Z_5$ | * | 1 | 1 | 1 | 1 | * | 0 | 0 | 0 | 0 |
| $Z_6$ | 0 | 1 | 1 | 1 | 0 | 1 | 1 | 0 | 0 | 0 |
| $Z_7$ | 0 | 1 | 1 | 0 | 0 | 1 | 1 | 1 | 0 | 0 |
| $Z_8$ | 0 | 1 | 0 | 0 | 0 | 1 | 1 | 1 | 1 | 0 |

* REPRESENTS INDETERMINATION OR DISREGARD

| LATCH Li INPUT | | | | | | | | SYNCHRONISATION SIGNAL OUTPUT |
|---|---|---|---|---|---|---|---|---|
| 1 | 2 | 3 | 4 | 5 | 6 | 7 | 8 | |
| H | H | H | H | L | L | L | L | CLK 1 |
| H | H | H | L | L | L | L | H | 2 |
| H | H | L | L | L | L | H | H | 3 |
| H | L | L | L | L | H | H | H | 4 |
| L | L | L | L | H | H | H | H | 5 |
| L | L | L | H | H | H | H | L | 6 |
| L | L | H | H | H | H | L | L | 7 |
| L | H | H | H | H | L | L | L | 8 |

IN THE CASE OF N=3

(1) TERMINAL Ⓐ : REFERENCE SIGNAL
(2) TERMINAL Ⓑ : VCO OUTPUT
(3) TERMINAL Ⓒ : VCO OUTPUT
(4) TERMINAL Ⓐ : $\overline{\text{VCO OUTPUT}}$
(5) TERMINAL Ⓑ : REFERENCE SIGNAL i) SWP ii) 90°+θ
   90°
   90°−θ

PHASE-LOCKED SIGNAL GENERATOR

BACKGROUND OF THE INVENTION

1. Field of the Invention

The present invention relates to a phase-locked signal generator for generating a clock signal phase-locked with a trigger signal and a level comparator used for the phase-locked signal generator.

2. Related Background Art

In a video memory for storing, e.g., a video signal in a semiconductor memory, a sampling clock synchronized with a horizontal synchronization signal of an input video signal must be formed. For this purpose, a phase-locked signal generator having an arrangement of FIG. 1 is used in a conventional system. An operation of the phase-locked signal generator in FIG. 1 will be described with reference to FIG. 2.

When an input terminal A is set at H level, a square wave pulse having a period of $2\tau$ is oscillated and appears at an output terminal B by means of a NAND gate 15 and a delay line 17 having a delay time $\tau$ through an inverter 16. When a synchronization trigger signal set at L level within a predetermined pulse width T1 from a leading edge (or trailing edge) of the horizontal synchronization signal is input to the input terminal A, an output from the NAND gate 15 is forcibly set at H level within the pulse width T1, and the output terminal B is set at "L" level. Upon a lapse of the pulse width T1 at the input terminal A, the output from the NAND gate 15 goes to L level (therefore the output terminal B is set at H level), and a square wave pulse having the period $2\tau$ is oscillated and output at the output terminal B. If the pulse width T1 and the delay time $\tau$ are constants, a sampling clock signal having the period of $2\tau$ synchronized with the horizontal synchronization signal appears at the output terminal B.

In a conventional laser beam printer (to be referred to as an LBP hereinafter), a beam deflection position and a timing of a beam modulated with an image signal are very important factors. The beam deflection position and the beam modulation timing largely influence quality of the resultant image. For this reason, a detection signal from a beam position detection unit for detecting a beam deflection position and a clock input to a laser beam modulator must be in phase. For this purpose, a synchronization oscillator almost free from jitter is required to generate this clock.

A conventional arrangement for obtaining a phase-locked oscillation signal almost free from jitter is shown in FIG. 3. As shown in FIG. 3, a clock having a frequency which is N times a necessary fundamental frequency (f0) is generated and is frequency-divided into 1/N, so that a jitter amount for the synchronization pulse is set to 1/N the fundamental clock period.

Referring to FIG. 3, a beam position detection unit 21 outputs a detection signal for a beam representing a beam deflection position. A clock oscillator (OSC) 22 oscillates a clock having a frequency which is N times the fundamental clock frequency f0. A D flip-flop (D-FF) 23 generates a reset pulse for synchronously resetting a 1/N counter 25 and a 1/n counter 24 (both will be described in detail below) in response to an N-time clock by using the detection signal and a time error of 1/Nf0 or less. The 1/n counter 24 determines generation of a pulse representing that the detection signal is detected and the synchronized fundamental clock has been generated, and at the same time determines a period for outputting the synchronized fundamental clock. The 1/N counter 25 is reset in response to the synchronization pulse as an output from the D-FF 23 and frequency-divides the N-time clock into 1/N.

An operation of the conventional arrangement described above will be described with reference to FIG. 4.

Referring to FIG. 4, when a synchronization pulse b representing a beam deflection position rises during a time interval between time t1 and time t2, the 1/N counter 25 is reset to stop oscillation of the fundamental clock f0, and counting of the 1/n counter 24 is started. The 1/n counter 24 counts a desired period from the input of the synchronization pulse to generation of the fundamental clock and generates a reset pulse e at time t3, thereby resetting the D-FF 23. An output from the D-FF 23 is inverted in accordance with the reset pulse e. The 1/n counter 24 stops counting from time t4. The 1/N counter 25 starts counting and outputs a clock having the frequency f0. Since a jitter amount of the fundamental clock f and the detection signal b from time t4 is a maximum of (t2 −t1) and can be smaller than 1/N or less of the period of the fundamental clock.

In the conventional arrangement shown in FIG. 1, however, since frequency precision of the synchronization clock signal is determined by the delay time $\tau$ of the delay line 17, expensive parts such as a pulse delay line and adjustment such as selection of a tap or the like are required. In addition, since the threshold value of the NAND gate 15 is not generally stabilized by a temperature and a power source voltage, it is difficult to stably set the threshold level to a predetermined value.

In the conventional arrangement shown in FIG. 3, the N-time clock is required to obtain the necessary fundamental clocks f0. According to the knowledge of the present inventor, although a fundamental clock in an LBP having a resolution of 2400 DPI (dot per inch) about 1.55 MHz, a fundamental clock in a 600-DPI LBP has a frequency of 9.69 ($=1.55\times(600/240)^2$) MHz, i.e., in proportion to a square of the resolution, because horizontal and vertical resolution components must be balanced. Even if a jitter amount is allowed up to ⅛ the fundamental clock period, an initial oscillation frequency is 12.4 MHz in a 2400-DPI LBP, but an initial oscillation frequency requires a 77.5-MHz oscillator in a 600-DPI LBP.

When an oscillation signal having such a high frequency is used, the following problems are posed.

(1) It is very difficult to obtain a quartz crystal oscillator for oscillating a fundamental wave of 77.5 MHz as an initial oscillation frequency.

(2) In a quartz crystal oscillator using an overtone mode such as 3-time overtone mode, since a tuner such as a coil or a capacitor is required, a total cost is undesirably increased by adjustment and an additional circuit.

(3) Since the oscillation frequency is very high, the 77.5-MHz signal serves as an unnecessary radiation component for other peripheral circuits and peripheral equipment, thereby adversely affecting the operation.

(4) It is very difficult to perform accurate operations in gate arrays or the like because an operating frequency is high.

On the other hand, in a television signal color encoder such as an NTSC color encoder, since B-Y and R-Y signals are modulated with 0° and 90°, respectively, carrier signals (3.58 MHz) having phases of 0° and 90° are required.

Conventional carrier signals having the phases of 0° and 90° are formed by a signal obtained by digitally counting down a clock signal having a high frequency into 1/N, as shown in FIG. 5. FIG. 5 is a block diagram showing an arrangement for forming the carrier signals having phases of 0° and 90°, and FIG. 6 is a timing chart showing an operation of the circuit in FIG. 5.

Referring to FIG. 5, a counter 5 counts down a clock CLK into 1/N. In this case, N is selected so that a frequency of a counter output becomes 3.58 MHz×2. D-flip-flops (D-FFs) 6 and 7 receive a positive output (a) and a negative output (b) as trigger pulses from the counter 5. The D-FFs 6 and 7 output carrier signals having 0° and 90°, respectively. Timings of the above signals are shown in FIG. 6.

Another method of forming carrier signals having phases of 0° and 90° is to use a phase-locked oscillator. FIG. 7 is a block diagram of a phase-locked oscillator. Referring to FIG. 7, a phase comparator 1 compares a phase of a reference signal (c) and VO of an output from a VCO (voltage-controlled oscillator) 3 and outputs a phase error (d). A low-pass filter (LPF) 2 smoothes a phase error output from the phase comparator 1. The VCO 3 changes an output frequency in accordance with the phase error voltage (e) smoothed by the LPF 2. In order to obtain a 90° signal from the output VO from the VCO 3 with respect to the reference signal, the phase comparator 1 is designed so that zero phase error is output with a 90° phase difference.

FIG. 8 is a timing chart showing a case wherein zero phase error is obtained with the phase of 90°. The output VO and the phase error (d) are set in a 90° phase state with respect to the phase of the reference signal (c). When the output from the phase comparator 1 is smoothed by the LPF 2, a phase error voltage (e) has an intermediate level. At this time, the phase error voltage (e) is set at a level (e)−1, and the VCO is oscillated at the same frequency as the reference signal. The phase of the output from the VCO 3 is advanced from the reference signal (c) as indicated by VO'. Control is performed such that the output from the phase comparator 1 becomes an output (d)', the level of the phase error voltage (e) is increased to (e)−2, the oscillation frequency of the VCO 3 is increased, and the phase of the output from the VCO 3 is set to 90° with respect to the reference signal (c). When the output from the VCO 3 becomes VO'', a reverse operation is performed. Control is performed such that the phase error voltage becomes reduced to (e)−3, the oscillation frequency of the VCO 3 is decreased, and the output from the VCO 3 has a 90° phase difference with respect to the reference signal (c).

In the color signal encoder, however, color misregistration occurs even if the phase difference of an input carrier is shifted from 90° by ±1° to 2°. Therefore, the following problems are posed by the conventional arrangement.

In the count-down scheme (FIG. 5), (1) since the carrier frequency is 3.58 MHz (NTSC scheme), a clock must be a high-frequency clock so as to stably obtain a high-precision 90° phase difference; and (2) two carrier signal inputs are required for a color encoder.

In the phase-locked oscillator (FIG. 7), (3) Although the phase is ideally locked with a phase error of 90°, another phase error different from that of the input signal occurs due to variations in elements constituting a circuit, and an error occurs in the locked phase.

SUMMARY OF THE INVENTION

It is an object of the present invention to solve the conventional problems described above.

It is another object of the present invention to improve a phase-locked signal generator.

It is still another object of the present invention to provide a phase-locked signal generator capable of generating a phase-locked clock signal having a relatively high frequency without using expensive circuit elements.

It is still another object of the present invention to provide a phase-locked signal generator for generating a synchronization clock signal almost free from phase jitter at an accurate frequency without using an oscillator having a frequency higher than that of a target output clock signal.

It is still another object of the present invention to generate a stable synchronization clock signal.

It is still another object of the present invention to reduce a phase error and provide a high-precision phase difference signal.

It is still another object of the present invention to provide a level comparator suitably used for the phase synchronization signal described above to reduce an influence of characteristic variations in circuit elements and allow accurate level comparison.

The above and other objects, features, and advantages of the present invention will be more apparent from the following detailed description and the appended claims in conjunction with the accompanying drawings.

BRIEF DESCRIPTION OF THE DRAWINGS

FIGS. 43(i) and 43(ii) are waveform charts representing an operating state of the seventh embodiment.

DETAILED DESCRIPTION OF THE PREFERRED EMBODIMENTS

First Embodiment

Figure 1:
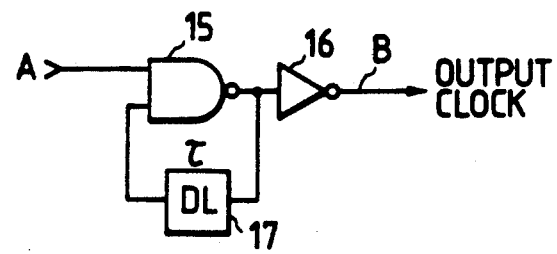
FIG. 1 is a block diagram showing a conventional phase-locked signal generator.
Figure 2:
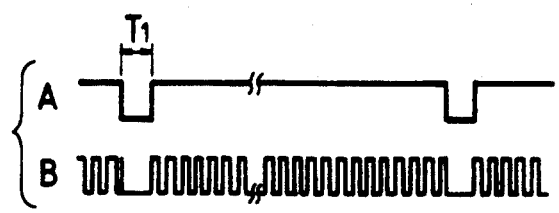
FIG. 2 is a timing chart for explaining an operation of the phase-locked signal generator shown in FIG. 1.
Figure 3:
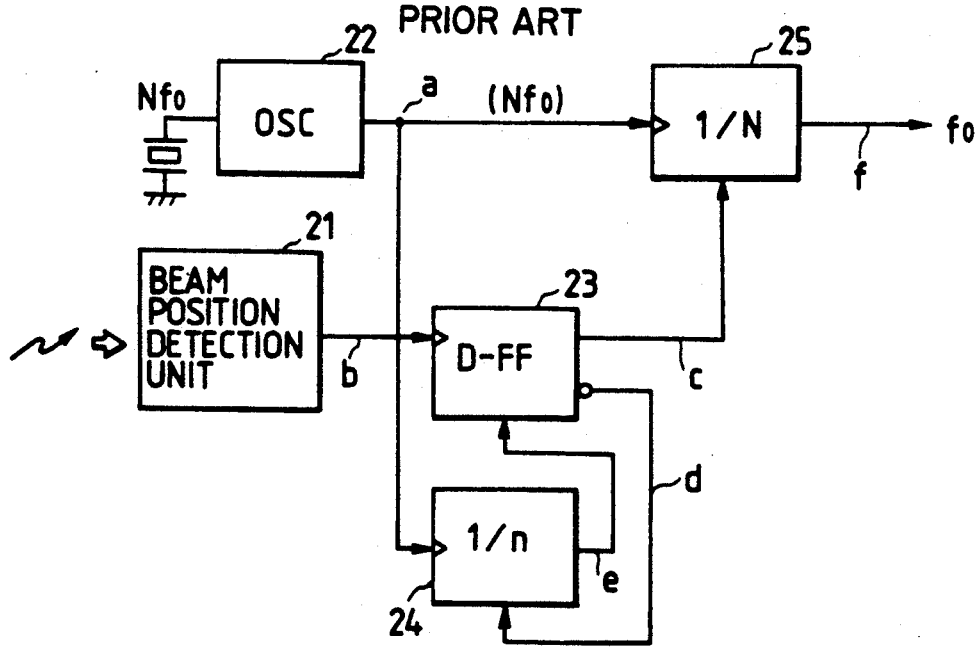
FIG. 3 is a block diagram showing another conventional phase-locked signal generator.
Figure 4:
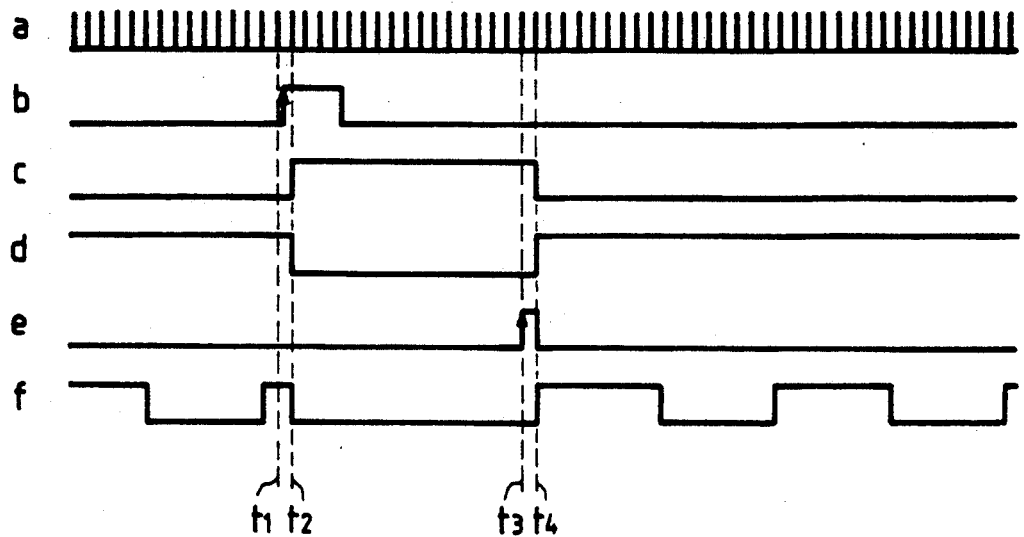
FIG. 4 is a timing chart for explaining an operation of the phase-locked signal generator shown in FIG. 3.
Figure 5:
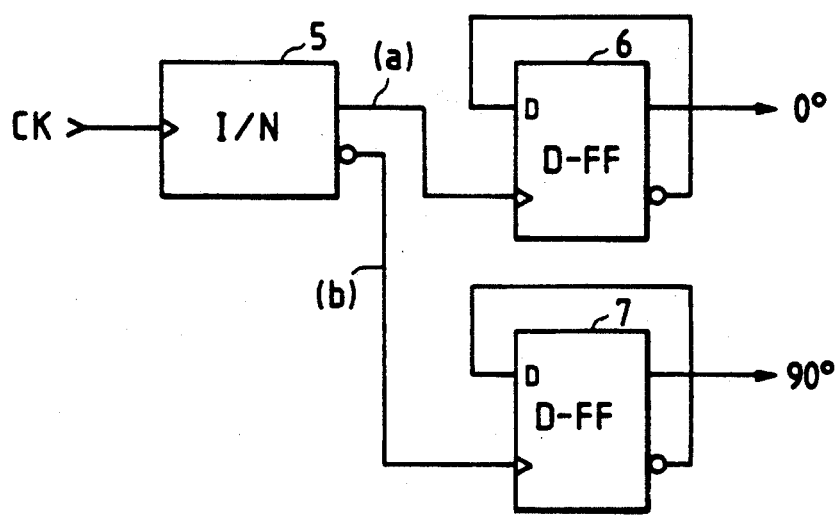
FIG. 5 is a block diagram of still another prior art.
Figure 6:
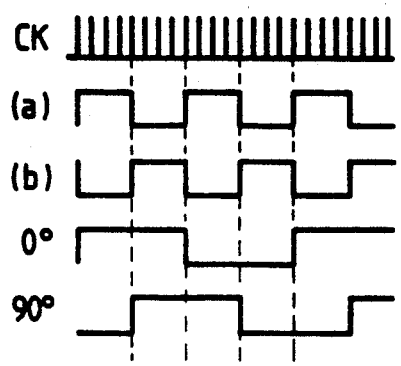
FIG. 6 is a timing chart for explaining an operation of the prior art shown in FIG. 5.
Figure 7:
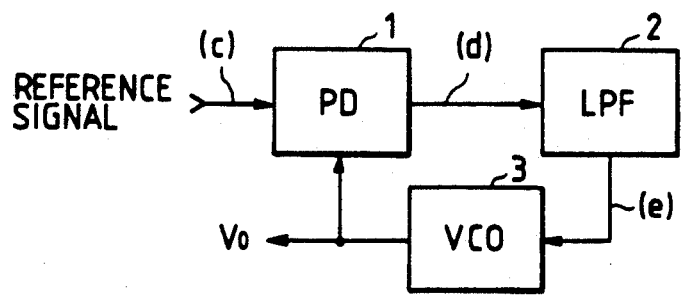
FIG. 7 is a block diagram showing still another prior art.
Figure 8:
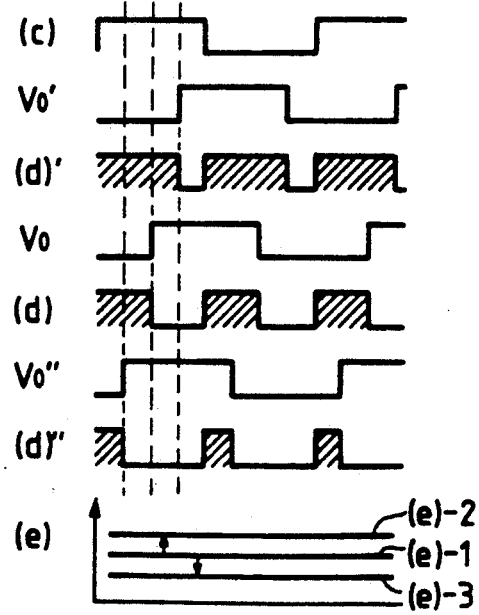
FIG. 8 is a timing chart for explaining an operation of the prior art shown in FIG. 7.
Figure 9:
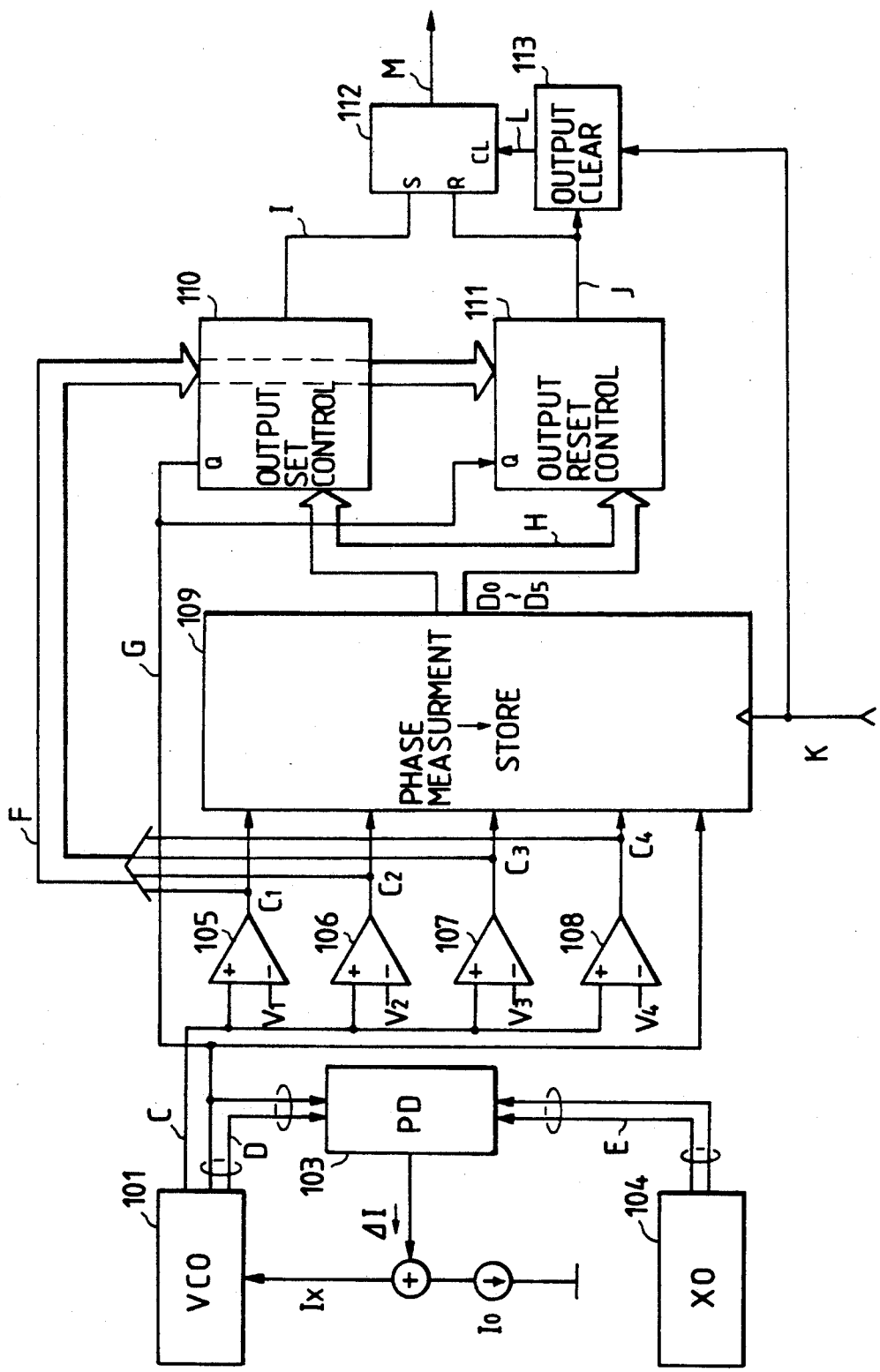
FIG. 9 is a block diagram of a phase-locked signal generator according to the first embodiment of the present invention.

FIG. 9 is a block diagram showing an overall arrangement of a phase-locked signal generator according to the first embodiment. A portion comprising a VCO 101, a phase comparator (PD) 103, and a quartz crystal oscillator (XO) 104 constitutes a triangle wave generator for generating a triangle wave having the same period as that of the synchronization clock signal.

Figure 11:
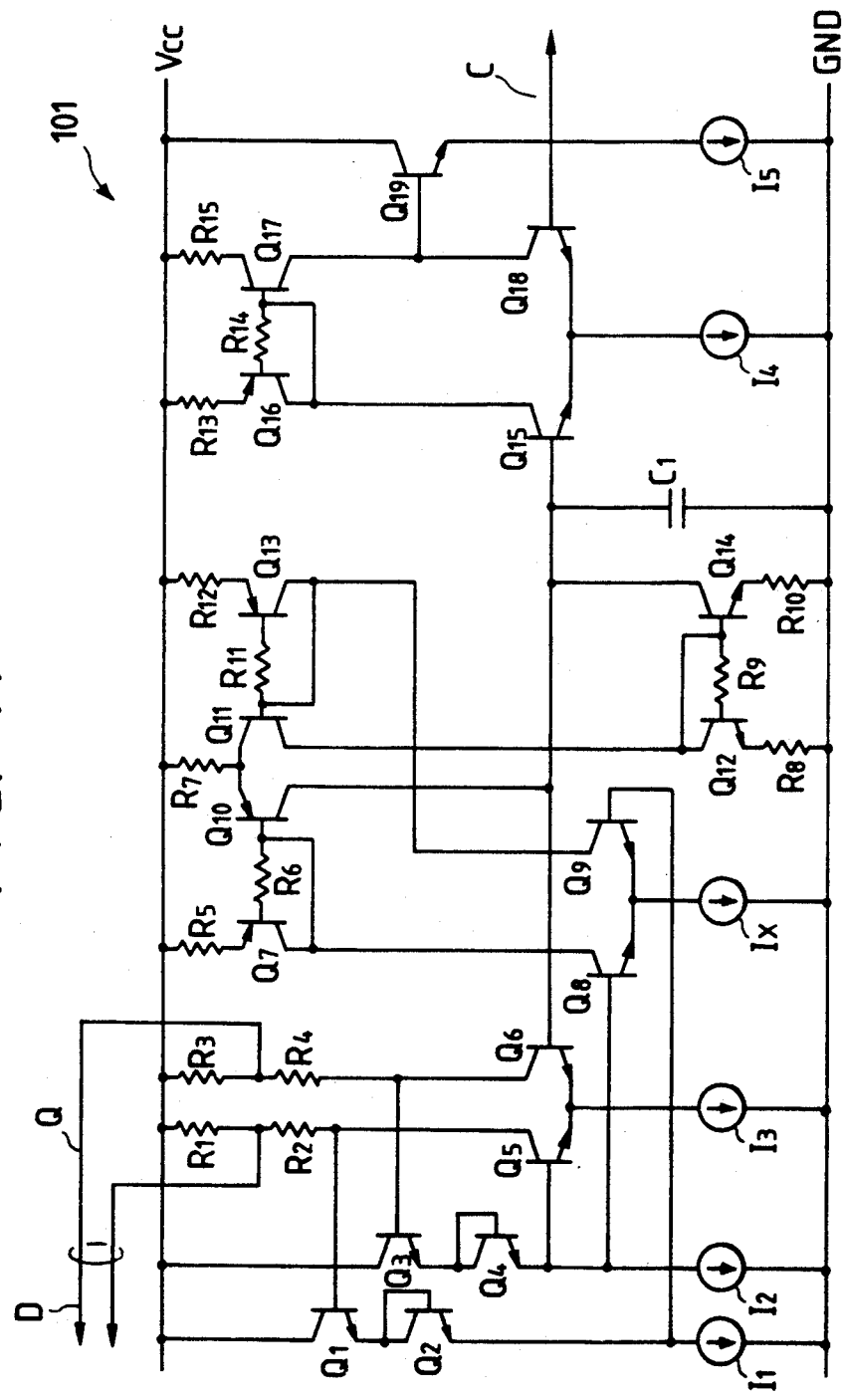
FIG. 11 is a circuit diagram showing an arrangement of a frequency adjustable oscillator shown in FIG. 9.

An internal circuit in the VCO 101 has an arrangement shown in FIG. 11.

Transistors Q1 and Q3, transistors Q2 and Q4, transistors Q5 and Q6, transistors Q8 and Q9, transistors Q7 and Q10, transistors Q11 and Q13, transistors Q12 and Q14, transistors Q15 and Q18, and transistors Q16 and Q17 are paired. At the same time, conditions R1=R3, R2=R4, R5=R7=R12=R6/2=R11/2, R8=R10=R9/2, and R13=R15=R14/2 are established. The phase-locked signal generator includes constant current sources I1 to I5 and a control constant current source IX (its current, a collector current, and a control current are also referred to as IX )for determining a frequency of a triangle wave signal. Assume that the emitter of the transistor Q4 is set at H level (VCC−2VBE), and that the emitter of the transistor Q2 is set at L level (VCC −2VBE−(R1+R2).I3). In a differential pair comprising the transistors Q8 and Q9, the transistor Q8 is turned on (the transistor Q9 is turned off). The current IX flows from the collector to a capacitor C11 by a current mirror circuit constituted by the transistors Q7 and Q10, thereby charging a capacitor C1. The base voltage of the transistor Q6 is monotonically increased accordingly. When this base voltage reaches near (VCC−2VBE), a current gradually flows through the transistor Q6, and the emitter voltage of the transistor Q4 is gradually decreased (i.e., the emitter voltage of the transistor Q2 is gradually increased). The transistor Q6 is then turned on, the emitter of the transistor Q4 goes to L level (VCC−2VBE−(R3+R4).I3), the transistor Q5 is turned off, and the emitter of the transistor Q2 goes to H level (VCC−2VBE). At this time, the transistor Q9 is turned on (i.e., the transistor Q8 is turned off), and the collector current IX flows through the transistor Q11 by a current mirror circuit constituted by the transistors Q11 and Q13. A charge current flows in the capacitor C1 by the collector current IX of the transistor Q14, so that the base voltage of the transistor Q6 is monotonically decreased. When the base voltage of the transistor Q6 reaches near the level (VCC−2VBE−(R3+R4).I3), a current gradually flows through the transistor Q5. The emitter voltage of the transistor Q2 is gradually decreased (the emitter voltage of the transistor Q4 is gradually increased). The transistor Q5 is turned on, the emitter of the transistor Q2 goes to L level (VCC−2VBE−(R1+R2).I3), the transistor Q6 is turned off, and the emitter of the transistor Q4 returns to the initial state, i.e., H level (VCC−2VBE). These operations are repeated in the subsequent operations.

Figure 12:
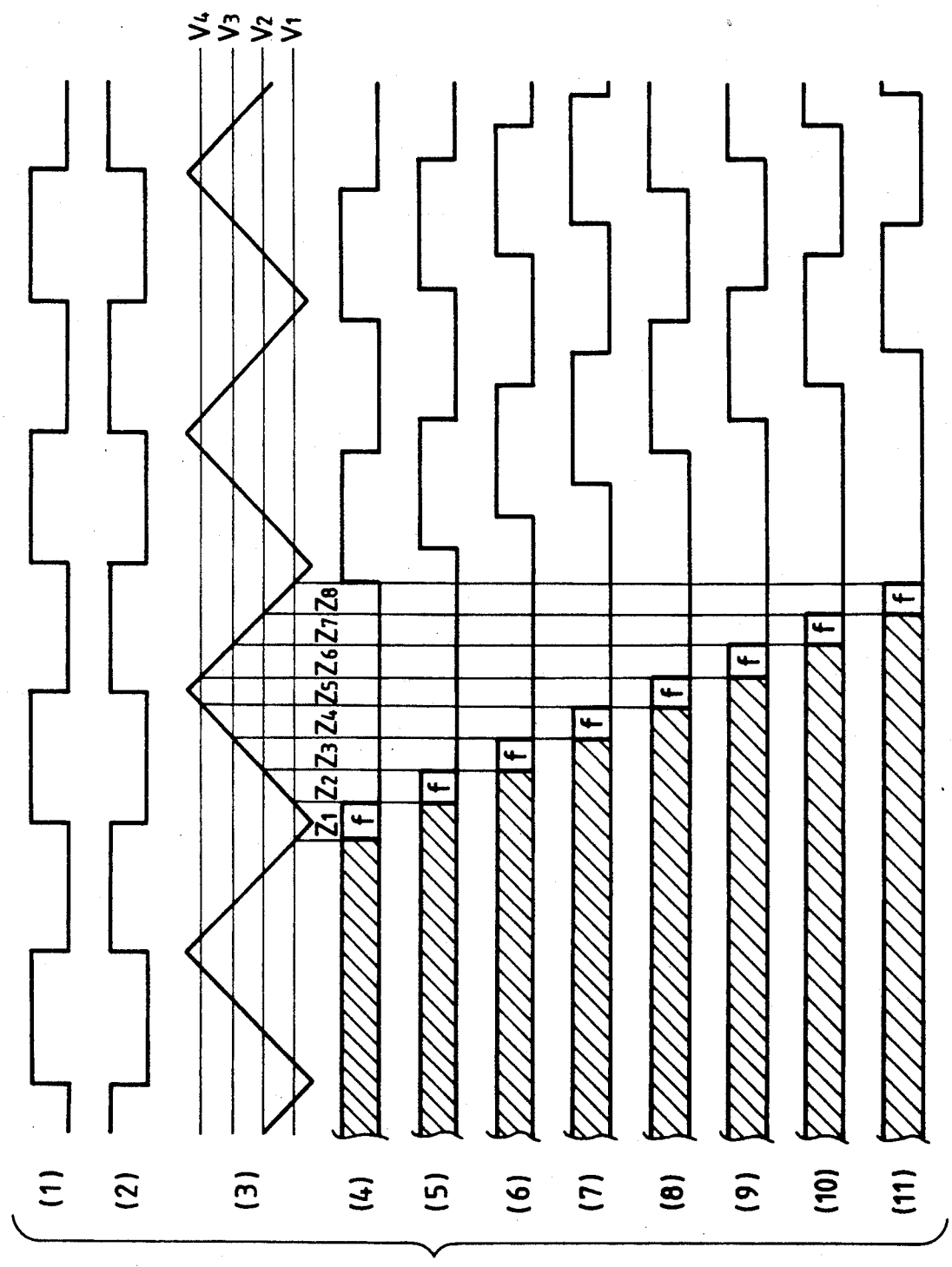
FIGS. 12(1) to 12(11) are timing charts for explaining an operation of the phase-locked signal generator shown in FIG. 9.

A triangle wave signal shown in FIG. 12(3) appears at the base of the transistor Q6 (i.e., the base of the transistor Q15). As shown in FIGS. 12(1) and 12(2), a differential square wave pair D are output (FIG. 12(1) shows a Q output).

The H level of the triangle wave signal shown in FIG. 12(3) is VCC−2VBE−ΔV, and its L level is VCC−2VBE−(R1+R2).I3+ΔV. The voltage ΔV is a voltage determined by the I3 and (R1+R2). Therefore, an amplitude becomes (R1+R2).I3−2ΔV.

The oscillation period becomes 2((R1+R2).I3−2ΔV).C1/IX.

Voltage-divided outputs through the resistors R1 and R2 and the resistors R3 and R4 are extracted as the differential square wave pair D because the amplitude is set to an appropriate amplitude as (0.2 $V_{p-p}$ to 0.3 $V_{p-p}$). Although not shown, this differential square wave pair D are appropriately buffered and are used as appropriate voltages. A circuit constituted by the transistors Q15, Q18, Q16, Q17, and Q19 serves as a feedback buffer circuit. A triangle wave signal coinciding with the one shown in FIG. 12(3) appears at an output terminal C.

Figures 13, 14:
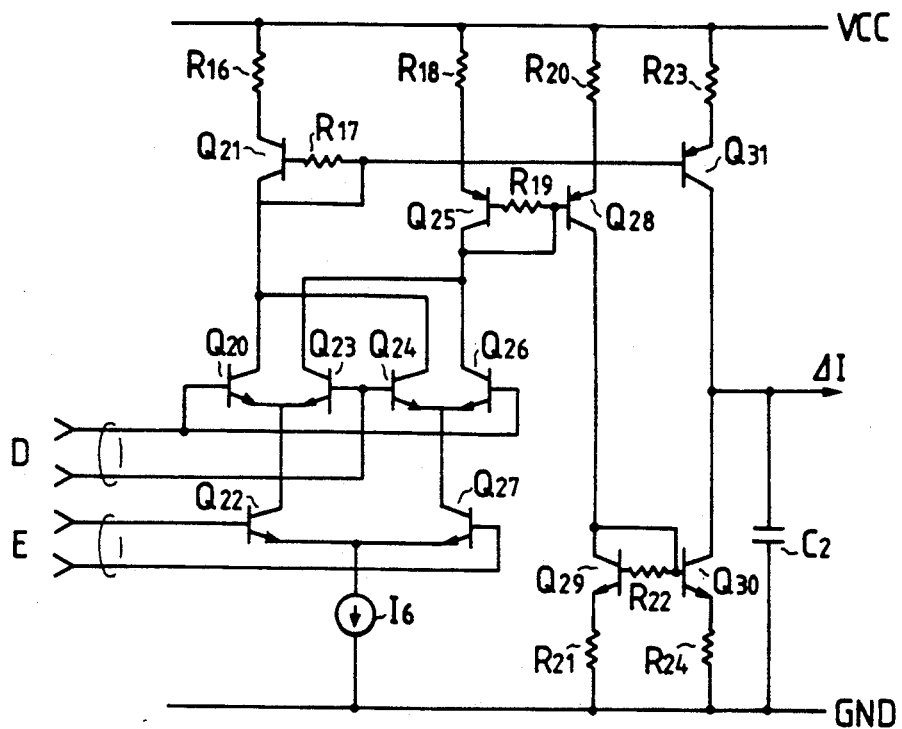
FIG. 13 is a circuit diagram showing a phase comparator shown in FIG. 9.
FIG. 14 is a table showing a relationship between phase measurement data and output reset timings.

FIG. 13 is a circuit diagram showing an arrangement of the phase comparator 103 (FIG. 9). Transistors Q20 and Q23, transistors Q24 and Q26, transistors Q22 and Q27, transistors Q21 and Q31, transistors Q25 and Q28, and transistors Q29 and Q30 are paired. At the same time, conditions R16=R23=R17/2, R18=R20=R19/2, R21=R24=R22/2 are established. This phase comparator 103 includes a constant current source I6.

The phase comparator 103 receives the output square wave pair D from the VCO 101 and the output square wave pair E from the quartz crystal oscillator 104. When the two pairs of square wave signals have the same frequency and a phase difference of ±90°, an average current level of the collector current of the transistor Q31 and the collector current of the transistor Q30 is set to I6/2. When a clock component is eliminated by a capacitor C2, an error current ΔI becomes zero. When the phases of the square wave pair D are delayed from those of the square wave pair E by ±90°, and the polarities of the square wave pairs are determined so that the current ΔI flows, the control current IX (=IO+ΔI where IO is a constant current) is increased. The oscillation frequency of the VCO 101 is increased to compensate for a phase delay. In this manner, the oscillation output from the VCO 101 is phase-locked with the quartz crystal or X'tal oscillator 104. Reference voltages V1 to V4 as the triangle wave output signals input from the VCO 101 to level comparators 105 to 107 are represented, respectively, as follows:

$$Vn = VCC - 2VBE + (R1+R2).I3 + \Delta V + (2n-1).((R1+R2).I3 - 2\Delta V)/8$$

(n=1, 2, 3, 4)

Output pulse signals C1 to C4 from the level comparators 105 to 108 are input to a phase measurement →store circuit 109. This circuit also receives the Q signal as the square wave output from the VCO 101. The phase measurement→store circuit 109 comprise latches for performing latching at the edge (a leading edge in this case) of a synchronization trigger signal input to an input terminal K. If a latch output of the Q output is defined as D0, and the latch output data of the signals C1 to C4 are defined as D1 to D4, latch output data (phase data) shown in FIG. 14 can be obtained by phase zones Z1 to Z8 of the synchronization trigger signal with respect to the triangle wave signal. This phase data is input to an output set control circuit 110 and an output reset control circuit 111. These two circuits also receive the output pulse signals C1 to C4 from the level comparators and the output square wave Q signal from the VCO 101.

Figure 10:
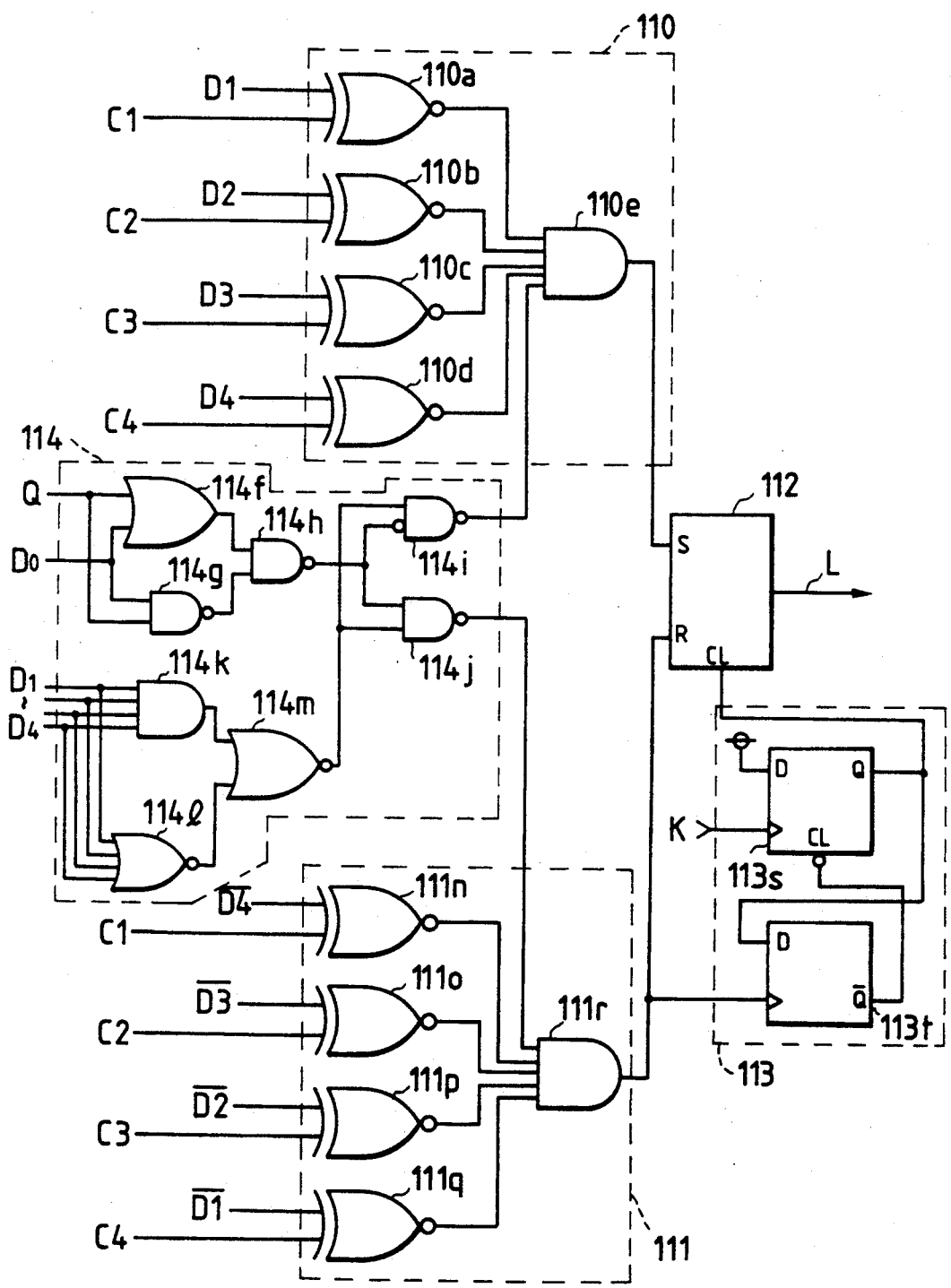
FIG. 10 is a block diagram showing a synchronization clock signal output logic circuit shown in FIG. 1.

FIG. 10 shows a logic circuit for performing the above operations.

A circuit comprising EXNOR gates 110a to 110d and a 5-input AND gate 110e serves as the output set control circuit 110. A circuit comprising EXNOR gates 111n to 111q and a 5-input AND gate 111r serves as the output reset control circuit 111. A circuit constituted by DFFs 113s and 113t is an output clear circuit 113. A circuit constituted by an OR gate 114f, a NOR gate 114m, NAND gates 114g to 114j, a 4-input AND gate 114h, a 4-input NOR gate 114l serves as a polarity data control circuit 114. These circuits are not illustrated in FIG. 9.

When an output obtained upon coincidence between the phase data D0 to D4 and the signals C0 to C4 is set, and when a reset timing is effected in response to the data defined by C0 to C4, as shown in FIG. 14, a square wave (duty ratio: 50%) synchronization clock signal appears at the output.

In the output reset control circuit, negative logic is used for the phase data (D1 to D4), and the order of data is reversed (i.e., $\overline{D4} \to \overline{D1}$ with respect to C1 to C4), as is apparent from FIG. 14 (this relationship is established regardless of the number of phase data and the number of level comparators). The circuit constituted by the gates 114k, 114l, and 114m is used to neglect the polarization data C0 when input synchronization trigger phase zones are set to Z1 and Z5 (i.e., the operation in the zones Z1 and Z5 is stabilized). Waveforms of output synchronization clock signals corresponding to the input synchronization trigger phase zones Z1 to Z8 are shown in FIGS. 12(4) to 12(11).

When the synchronization trigger signal is input, a Q output from the DFF 113s in the output clear circuit 113 goes to H level to clear an RSFF 112. Since the "clear" state is canceled when the first reset pulse (i.e., an output from the 5-input AND gate 111r) is output after the synchronization trigger signal is input, the "L" level of an output terminal L is guaranteed simultaneously with an input of the synchronization trigger pulse until the reset pulse is output. At this time, the pulse is kept to be the reset pulse, and the output terminal L is kept at "L" level. When a set pulse is generated in the next moment, the output goes to "H" level. Therefore, the synchronization clock output waveforms shown in FIGS. 12(4) to 12(11) are obtained. With this arrangement, present synchronization clock signals can be easily discriminated from the immediately preceding synchronization clock signals represented by hatched portions.

In this embodiment, the phase of the VCO which outputs a triangle wave signal is compared with that of the reference oscillator which outputs a signal having a frequency equal to that of a synchronization clock signal, and the output from the VCO is phase-locked with that from the reference oscillator. The resultant triangle wave signal is converted into pulse signals by a plurality of level comparators for level-comparing this triangle wave signal with different reference voltages. The pulse signals, and the square wave signal phase-locked with the triangle wave are respectively latched at input timings of the synchronization trigger signals. The phases of the synchronization trigger signals are measured and are stored until the next synchronization trigger signal is input. The output set control circuit and the output reset control circuit are controlled on the basis of these phase data. The output RSFF (flip-flop) is set and reset in response to the timings of the signals output from these circuits, thereby outputting the synchronization clock signal at the output of the RSFF. The synchronization clock signal stably synchronized with the synchronization trigger signal can be output without using a clock frequency higher than that of the synchronization clock signal.

In this embodiment, the synchronization clock signals are generated by the output set control circuit 110, the output reset control circuit 111, the SRFF112, and the like. However, signals represented in FIGS. 12(4) to 12(11) are generated from the signal C and the signals C1 to C4, and one of the generated signals may be selected by a multiplexer or the like on the basis of signals D0 to D5.

Second Embodiment

In order to stably operate the phase-locked signal generator, a peak voltage value and a DC voltage component of a triangle wave signal output from the triangle wave VCO 101 in FIG. 9 must be absolutely stabilized because comparison voltages V1 to V4 for an A/D converter from level comparators 105 to 108 are fixed. However, a triangle wave level VTRI varies depending on temperatures in a manner to be described below. A differential pair constituted by transistors Q8 and Q9 must be switched under the condition re5+re6=R1+R2 (or R3+R4) where ren is an emitter resistance of a transistor Qn, i.e., a loop gain becomes "1", so that the following conditions are derived:

re5+re6=R1+R2 re5=VT/IE5 re6=VT/IE6

IE5+IE6=I3 for VT=kT/Q (where k is a Boltzmann constant, T is the absolute temperature, and Q is the charge of electrons).

If a difference between a square wave level of (R1+R2).I3 and a triangle wave level is defined as ΔV, the following function can be derived:

$$\Delta V = 2VT \ln\left(\frac{1}{2}(1 - \sqrt{1 - 2VT/(R1 + R2)/I3})\right)$$

The triangle wave level VTRI can be represented as follows:

$$VTR1 = (R1 + R2) \cdot I3 - 2VT \ln\left(\frac{1}{2}(1 - \sqrt{1 - 2VT/(R1 + R2/I3)})\right)$$

Since the voltage VT changes depending on temperatures, the level VTRI also changes depending on temperatures.

Figure 15:
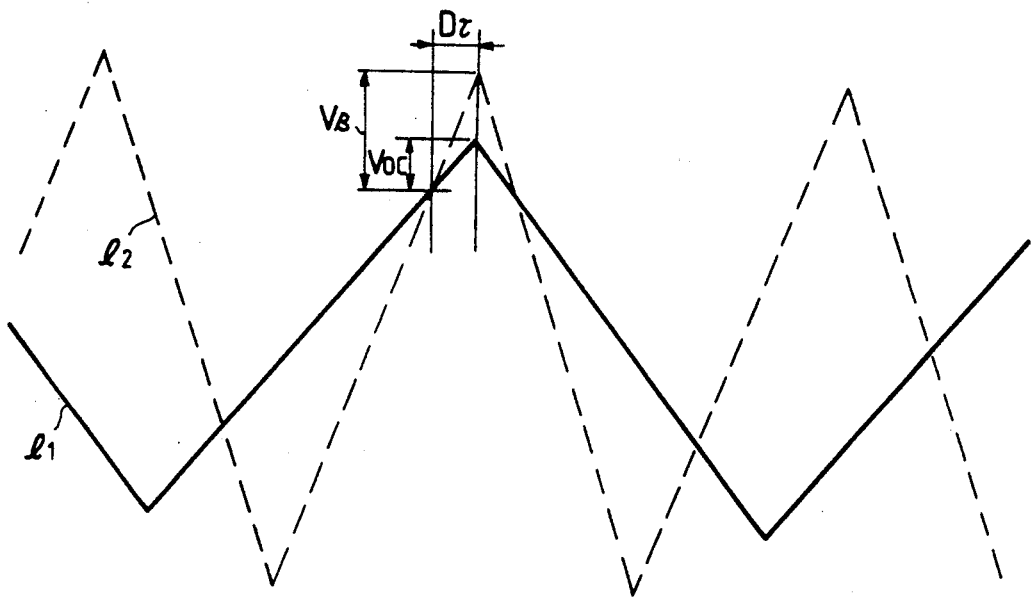
FIG. 15 is a view for explaining a comparative example in comparison with the second embodiment of the present invention.

A delay Dt occurs in switching of the charge and discharge currents of the capacitor C1 due to a parasitic capacitance in the circuit. As shown in FIG. 15, the triangle wave level is changed depending on frequencies.

Although an average DC voltage of the triangle wave is defined as VCC−R1+R2/2.I3−2VBE, it has relative precision (up to 3 mV) of relative precision (up to 2%) of a general IC resistance. The average DC voltage slightly varies.

When extremely high precision is required in an atmosphere of abrupt temperature changes, it is impossible to use an A/D converter comprising the level comparators 105 to 108.

According to the second embodiment, a charge pump circuit for performing charge and discharge operations on the basis of level comparator outputs to be A/D converted from an input analog signal level is arranged, and an output signal from the charge pump circuit is changed to reference voltages of the level comparators through, e.g., time constant circuits.

Figure 17:
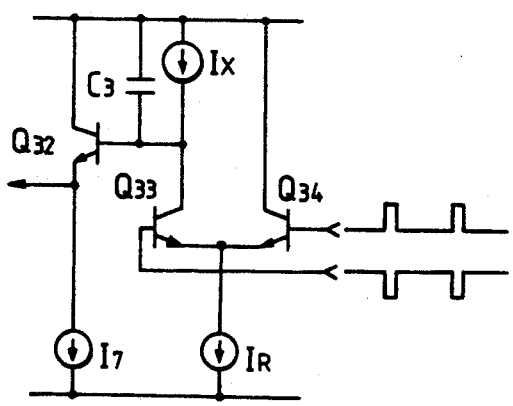
FIG. 17 is a circuit diagram of a charge pump circuit 115 shown in FIG. 16.
Figure 16:
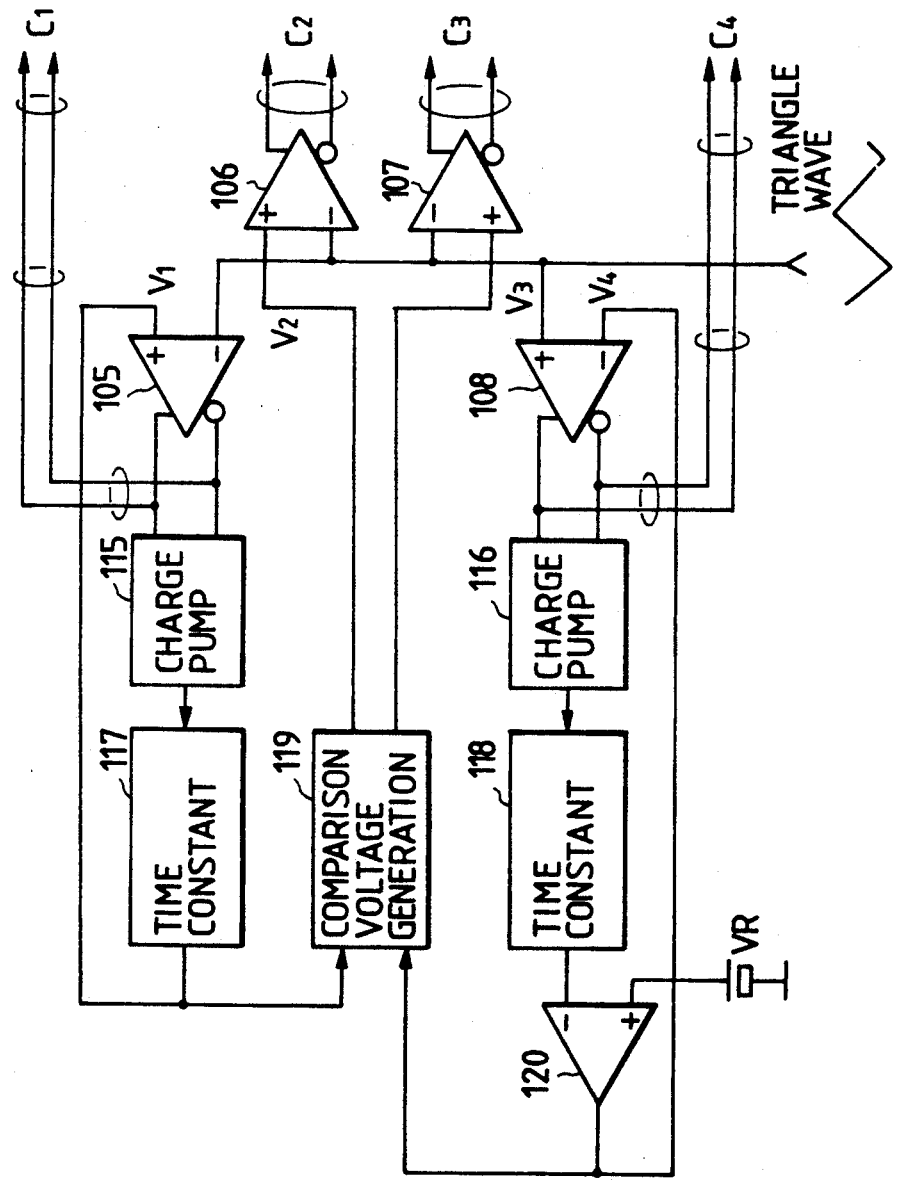
FIG. 16 is a block diagram showing an A/D converter of the second embodiment of the present invention.

FIG. 16 shows the second embodiment which uses an A/D converter in place of the level comparators shown in FIG. 9. Level comparators 105 to 108 are operated in the same manner as in FIG. 9, but outputs therefrom are obtained as a differential output. An output from the uppermost level comparator 105 is input to a charge pump circuit shown in FIG. 17. In this case, a current source IX=7IR/8. In general, a required pulse duty is defined as DU=(=TX/T), the current source IX is defined as follows:

$$IX = DU \cdot \left(\frac{1}{DU} - 1\right) \cdot IR$$

Figure 18:
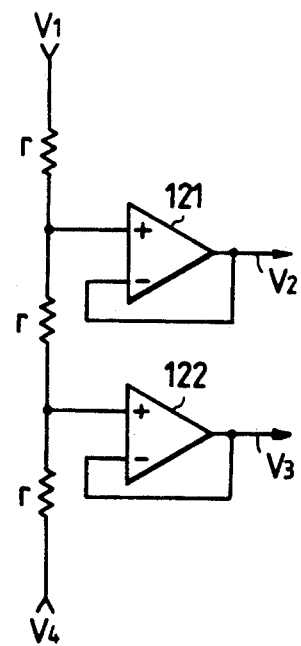
FIG. 18 is a circuit diagram of a comparison voltage generator 119 shown in FIG. 16.
Figure 19:
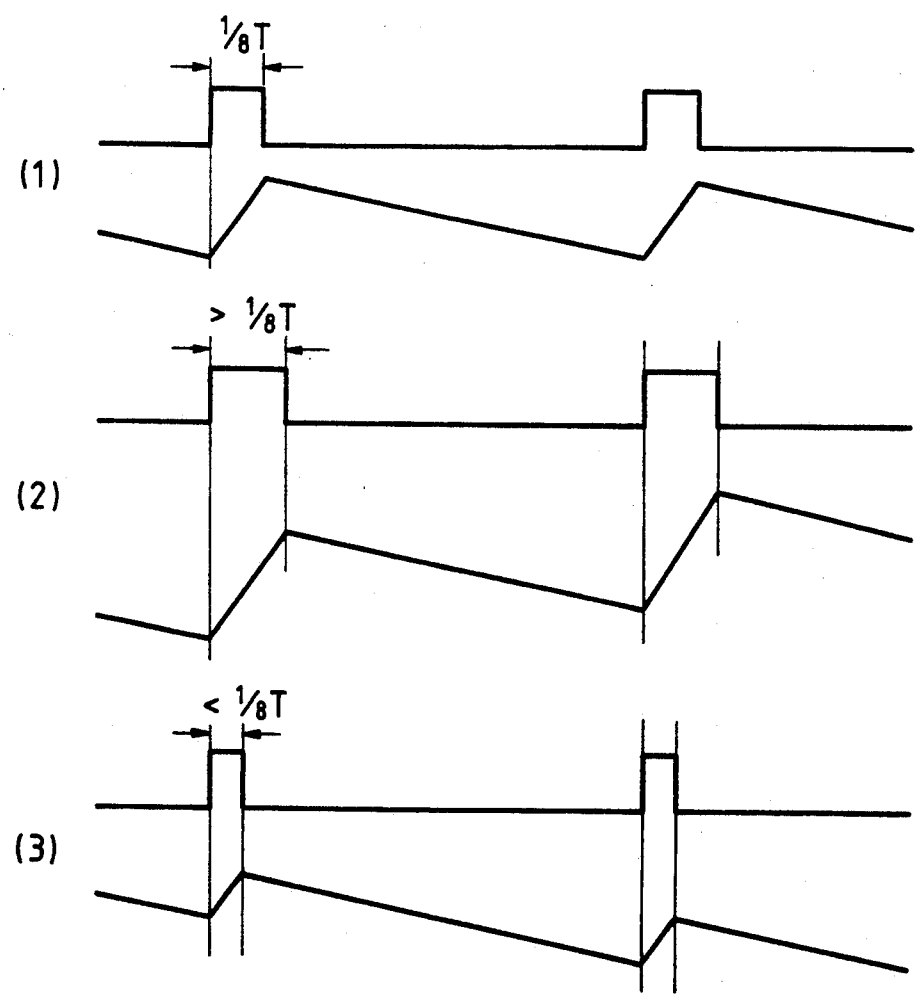
FIGS. 19(1) to 19(3) are timing charts for explaining an operation of the A/D converter shown in FIG. 16.

An output from the charge pump circuit 115 is input to a time constant circuit 117, so that a DC component is extracted. The extracted DC component serves as a reference voltage V1 for the level comparator 105. An output signal from the lowermost level comparator 108 is also input to a charge pump circuit 116 having the same arrangement as in FIG. 17, and its DC component is extracted by a time constant circuit 118. The extracted DC component is input to an inverting amplifier 120 having a gain G (e.g., G=1). An output form the inverting amplifier 120 serves as a reference voltage V4 for the level comparator 108. The reference voltages V1 and V4 are input to a comparison voltage generation portion 119. The comparison voltage generation portion 119 outputs reference voltages V2 and V3 which are then input to the level comparators 106 and 107, respectively. The comparison voltage generation portion 119 has an arrangement shown in FIG. 18. When the number of voltage divisions by resistors r, the number of level comparators can be increased. An operation of the level comparator 105 will be described above. The output voltage of the charge pump circuit 115 is balanced only when a positive pulse width (a negative pulse width of the transistor 33) of the transistor 34 (FIG. 17) is T/8 (where T is the period of the triangle wave), as shown in FIG. 19(1). When the pulse width is larger than T/8, as shown in FIG. 19(2), i.e., when a comparison voltage is excessively low, a DC voltage of the output from the charge pump circuit 115 is increased, and the reference voltage is increased, thereby correcting to narrow the pulse width. To the contrary, as shown in FIG. 19(3), when the pulse width is smaller than T/8, i.e., when the comparison voltage is excessively high, the DC voltage of the output from the charge pump circuit 115 is decreased, and the reference voltage is decreased, thereby correcting to widen the pulse width. In the case of the level comparator 108, the behavior of the DC voltage of the output from the charge pump circuit 116 becomes opposite to the behavior of the comparison voltage. In this case, when the charge pump circuit 116 is arranged in the same manner as the charge pump circuit 115, the inverting amplifier 120 is required.

When the IX of the charge pump circuit 116 is set to IR/8 and input differential signal components input to the transistors Q33 and Q34 are reversed, the inverting amplifier 120 is not required. A charge pump circuit may be arranged in each level comparator to generate the corresponding reference voltage, although the resultant level comparator becomes bulky. In this case, the IX of the charge pump circuit must be prepared to match with a desired pulse width. A time constant circuit may be omitted by a capacitance of a capacitor C3 used in the charge pump.

As described above, there is provided a charge pump circuit which performs a discharge operation on he basis of a digital signal output from the level comparator. The reference voltage of the level comparator is determined on the basis of an output from this charge pump circuit. A level comparator free from a peak level of a cyclic input analog signal such as a triangle wave signal and the DC voltage can be obtained, and a digital signal having a desired duty can be obtained. Since a desired pulse duty is defined by only the current source IX in the charge pump circuit, element variation conditions for resistors and transistors can be greatly reduced. Since only the pulse duty is checked, the desired digital signal is not associated with frequencies.

Third Embodiment

The third embodiment of the present invention will be described in detail with reference to the accompanying drawings.

Figure 20:
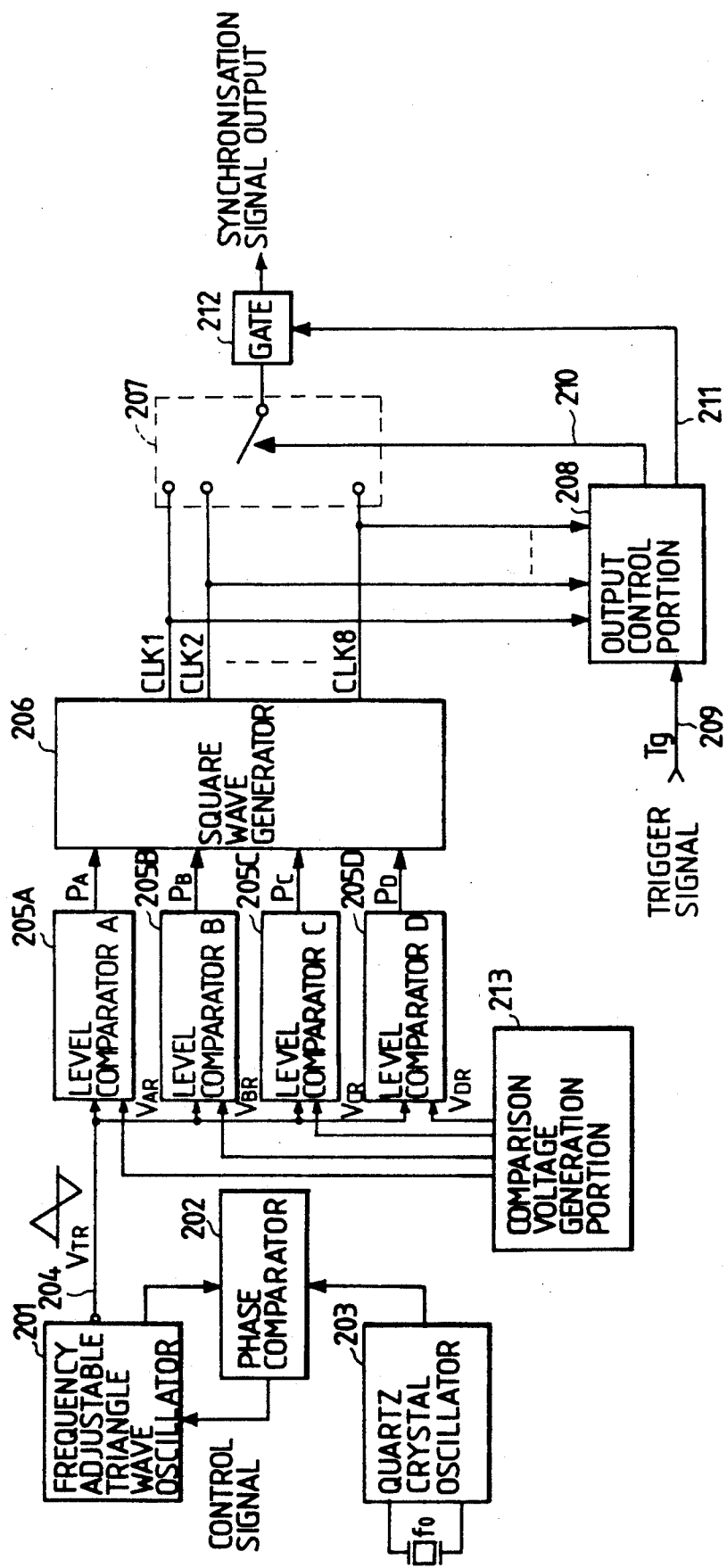
FIG. 20 is a block diagram showing the third embodiment of the present invention.
Figure 21:
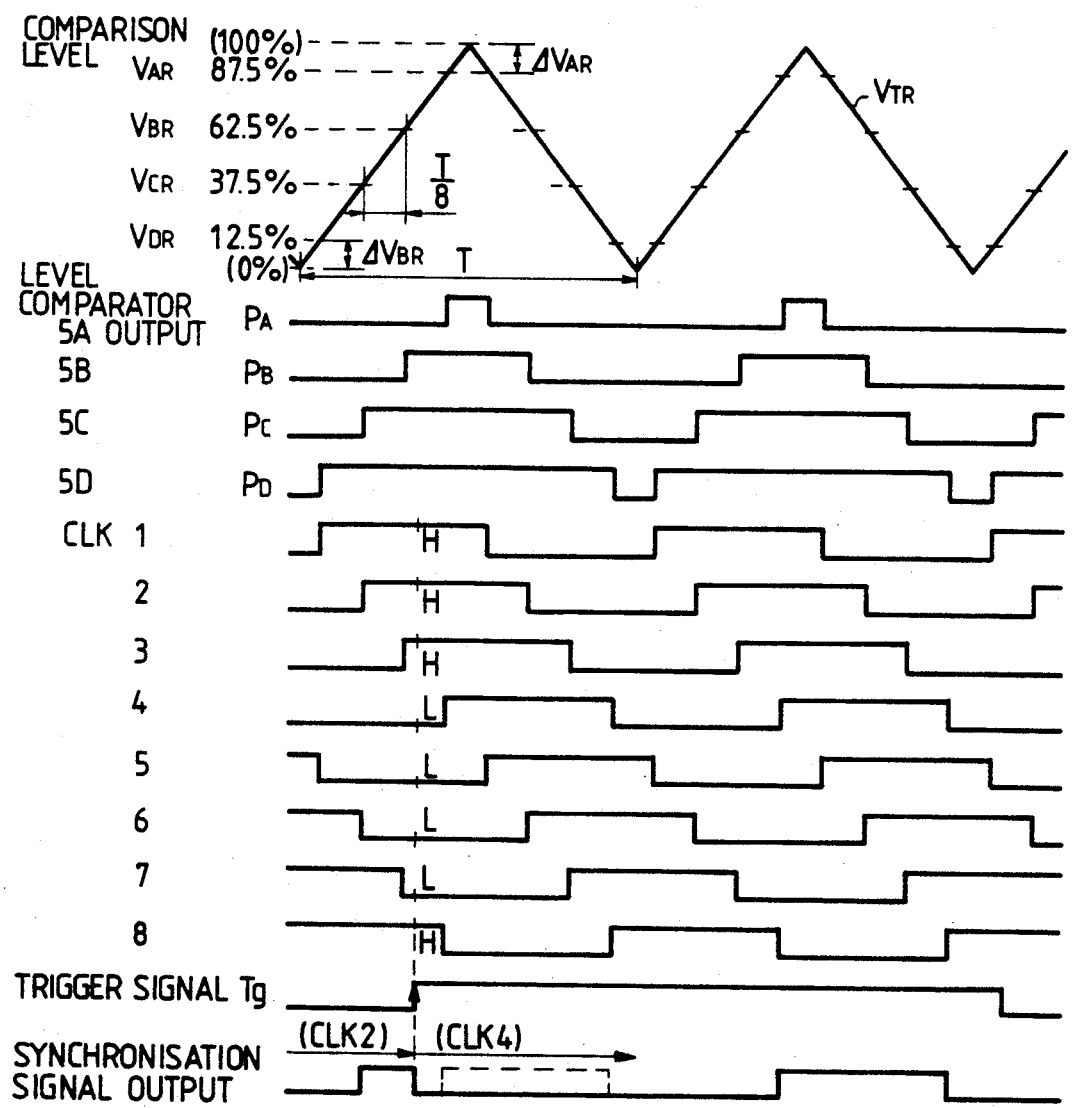
FIG. 21 is a timing chart showing a relationship between various signals in FIG. 20.

FIG. 20 shows a system using eight clock signals having different phases. FIG. 21 shows a relationship between the signals in this embodiment.

Referring to FIG. 20, a frequency adjustable triangle wave voltage-controlled oscillator (VCO) 201 is PLL (phased-locked loop) controlled by a quartz crystal oscillator 203 having a frequency f0 as a reference frequency and a phase comparator 202. The frequency of the VCO 201 is set equal to that of the quartz crystal oscillator 203 and has a phase shifted from that of the quartz crystal oscillator 203 by $-90°$. A triangle wave output 204 from the VCO 201 is compared with four levels VAR to VDR from a comparison voltage generation portion 213, so that four signals PA to PD are formed, as shown in FIG. 21. From these signals, eight 50%-duty clock signals CLK1 to CLK8 having eight phases shifted from each other by a $\frac{1}{8}$ period are formed.

When a trigger signal Tg asynchronously superposed on the clock pulses CLK1 to CLK8 is input from an external input terminal 209, one of the clocks which appears at the first leading edge of the trigger signal Tg is extracted through an output switch 207 controlled by an output switch control portion 208. At this time, one initial period upon a change sets a gate 212 to Low level (a so-called muting operation) so as to allow recognition of the change in phase at the receiving side of the synchronization signal output.

Figure 24:
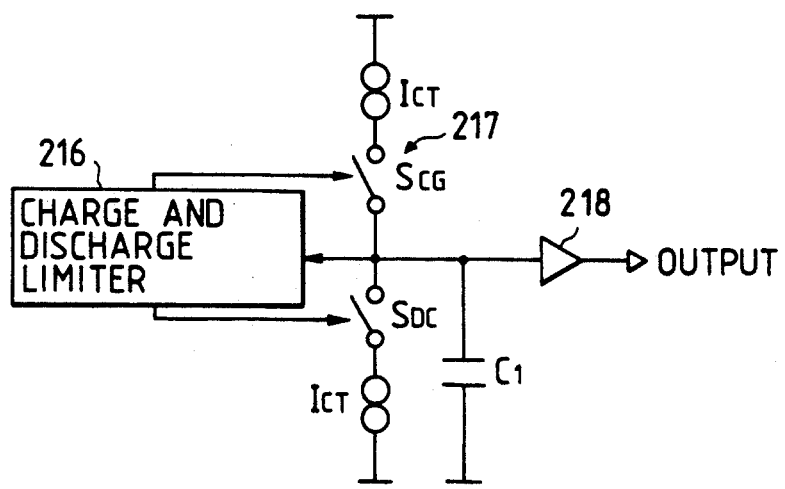
FIG. 24 is a circuit diagram showing a basic arrangement of a triangle wave oscillator.
Figure 25:
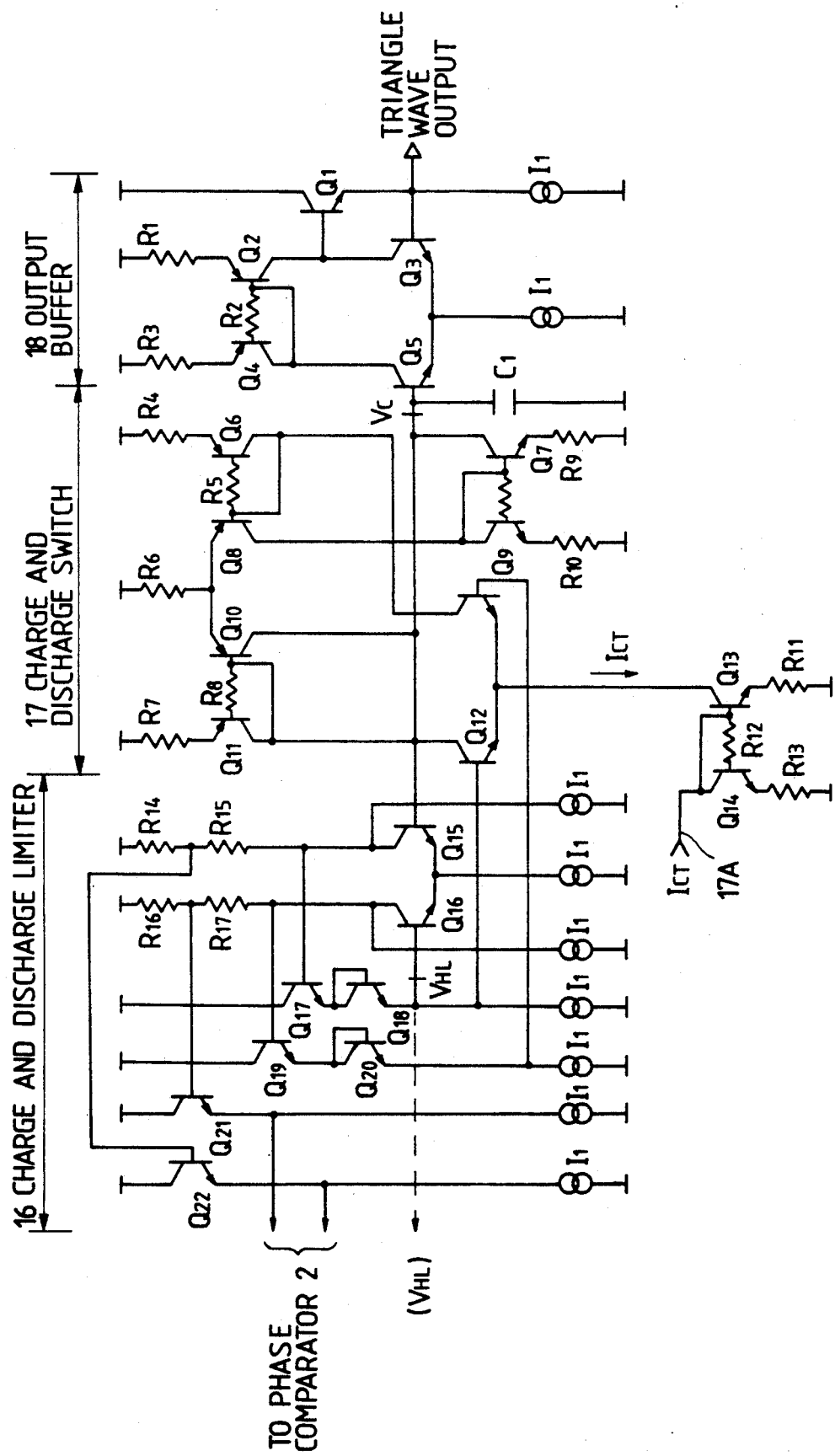
FIG. 25 is a circuit diagram showing a detailed arrangement of the triangle wave oscillator shown in FIG. 24.

The basic arrangement of the triangle wave oscillator 201 of this embodiment is shown in FIG. 24, and its detailed arrangement is shown in FIG. 25. As shown in FIG. 24, the triangle wave oscillator comprises a charge and discharge limiter 216, a charge and discharge switch (SCG and SDC) 217, a capacitor C1, and an output buffer 218. As shown in FIG. 25, the charge and discharge limiter 216 comprises resistors R14 to R17, transistors Q15 to Q22, and seven constant current sources I1. The charge and discharge switch 217 comprises resistors R4 to R13, and transistors Q6 to Q14.

The output buffer 218 comprises resistors R1 to R3, transistors Q1 to Q5, and two constant current sources I1.

In the charge and discharge limiter 216, the charge and discharge switch 217 is controlled to charge and discharge the capacitor C1 with a constant current ICT, thereby forming a triangle wave signal. Switching between charging and discharging is performed by comparing a voltage VC of the capacitor C1 with a comparison voltage VHL. Upper and lower limit voltages VH and VL of the comparison voltage VHL are represented as follows:

$$VH = VCC - VBEQ17 - VBEQ18$$

$$VL = VCC - (R14 + R15) \times I1 - VBEQ17 - VBEQ18$$

where VCC is the power source voltage, VBEQ17 is the base-emitter voltage of the transistor Q17, and VBEQ18 is the base-emitter voltage of the transistor Q18. An amplitude $\Delta VC$ is given as $\Delta VC = VH - VL = (R14 + R15) \times I1$. Therefore, an oscillation period T and a frequency f of the triangle wave signal are defined as follows:

$$T = \frac{2C1\Delta VC}{ICT},$$

$$f = \frac{1}{T} = \frac{ICT}{2C1\Delta VC}$$

The frequency f is set variable by changing the constant current ICT. In this embodiment, the comparison voltage VHL is changed in the form of a square wave, as indicated by a dotted line in FIG. 26 and serves as an output from a hysteresis comparator. A differential signal obtained by dividing this amplitude by a resistor is output from the triangle wave oscillator 201 to the phase comparator 202. The constant current ICT at the charge and discharge switches 217 is changed in accordance with a control signal input to a control input terminal 217A of the charge and discharge switch 217 in the triangle wave oscillator 201, thereby performing a PLL operation.

No discontinuous points are present in the triangle wave signal used in this embodiment. An absolute value of an ascending slope is equal to that of a descending slope. By using this triangle wave signal, any countermeasure for detection near a discontinuous point, which is required in use of a signal having a discontinuous point, such as a saw-tooth wave, need not be produced. Even if a comparison level for the ascending slope is set equal to that of the descending slope, clock signals having a 50% duty ratio can advantageously be obtained.

Figure 27:
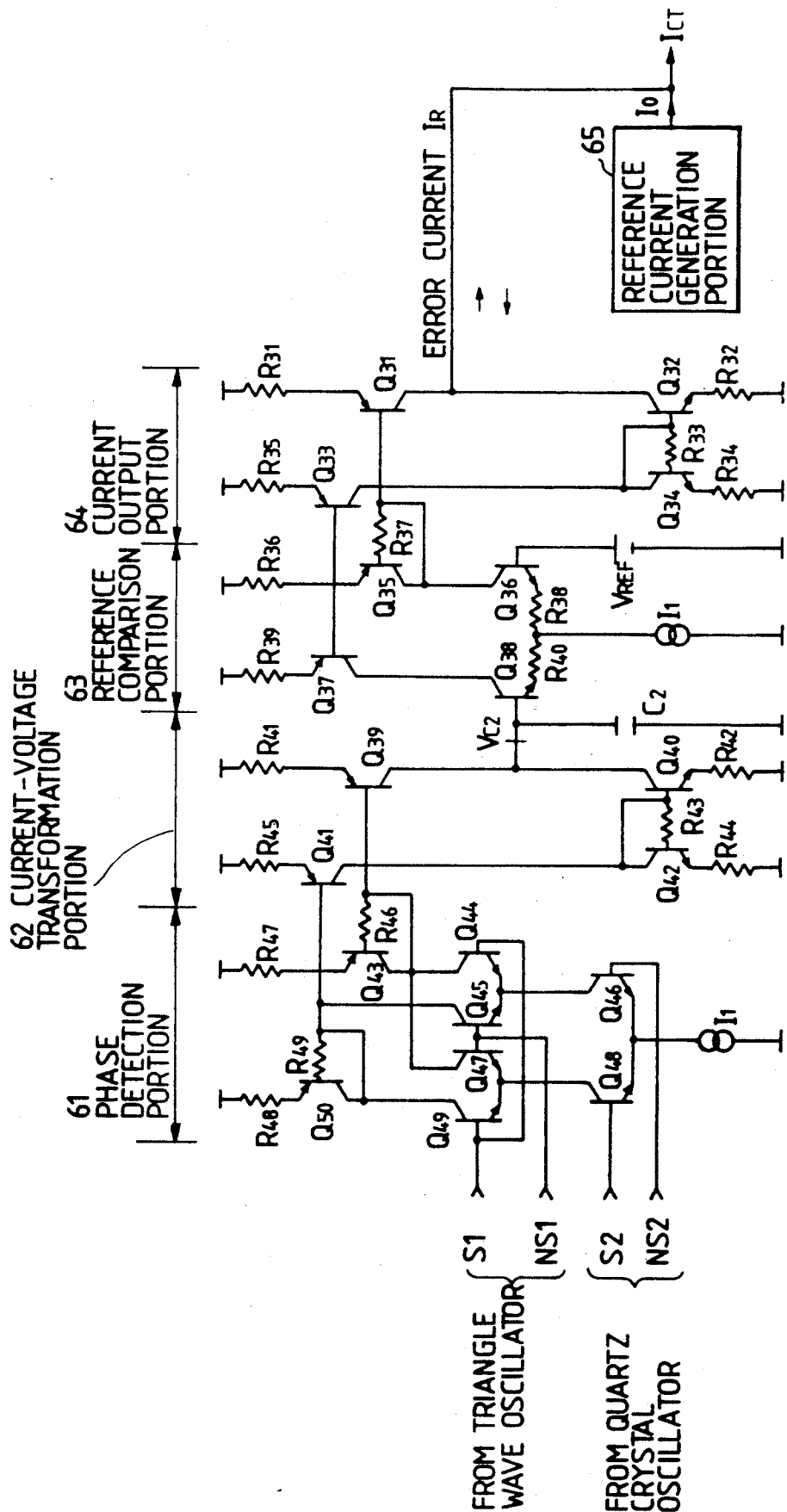
FIG. 27 is a circuit diagram showing an arrangement of a phase comparator.

An arrangement of the phase comparator 202 is shown in FIG. 27.

As shown in FIG. 27, the phase comparator 202 comprises a phase detection portion 61, a current-voltage transformation portion 62, a reference comparison portion 63, a current output portion 64, and a reference current generation portion 65. The phase detection portion 61 comprises resistors R46 to R49, transistors Q43 to Q50, and a constant current source I1. The current-voltage transformation portion 62 comprises resistors R41 to R45 and transistors Q39 to Q42. The reference comparison portion 63 comprises resistors R36 to R40, transistors Q35 to Q38, a constant current source I1, a capacitor C2, and a reference voltage source VREF. The current output portion 64 comprises resistors R31 to R35 and transistors Q31 to Q34.

The phase detection portion 61 compares phases of a differential signal pair of S1 and NS1 from the triangle wave oscillator 201 with the phases of a differential signal pair of S2 and NS2 from the quartz crystal oscillator 203. When a phase difference becomes −90°, a voltage VC2 of the capacitor C2 has a predetermined potential difference with respect to the reference voltage VREF. An error current IR from the current output portion 64 has a predetermined value, and the phase is stabilized. On the other hand, when the phase difference is changed from −90°, the error current IR is changed, and the value of the constant current ICT is changed by a control signal input to the triangle wave oscillator 201. The frequency of the triangle wave oscillator 201 is changed, so that the phase difference is controlled to −90°.

Figure 28:
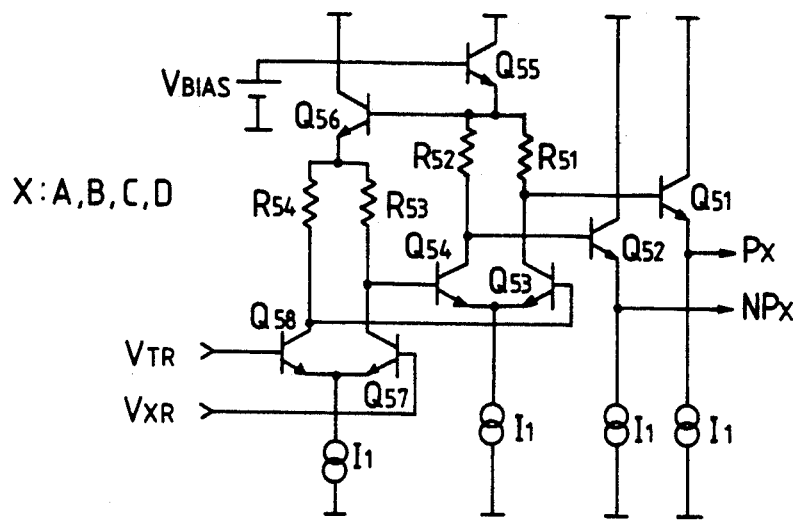
FIG. 28 is a circuit diagram showing an arrangement of a level comparator.

The arrangement of each of level comparators 205A to 205D is shown in FIG. 28. The level comparators 205A to 205D have the same arrangement, except for comparison reference voltages VAR, VBR, VCR, and VDR. Each level comparator comprises resistors R51 to R54, transistors Q51 to Q58, four constant current sources I1, and a bias power source VBIAS. The reference voltages VAR to VDR are determined to satisfy a relationship shown in FIG. 21 with respect to the amplitude of the triangle wave VTR. Change points of the outputs PA to PD from the level comparators are equally spaced apart from each other, i.e., at the pitch of T/8. Although not shown in FIGS. 20 and 21, inverted outputs NPx (x: A to D) are also output from the level comparators, respectively. In the next square wave generator 206, the signals CLK1 to CLK8 having eight different phases are generated using only the leading edges of the eight signals Px and NPx (x: A to D). The level comparators 205A to 205D can be used in a manner described with reference to the second embodiment.

Figures 22, 23:
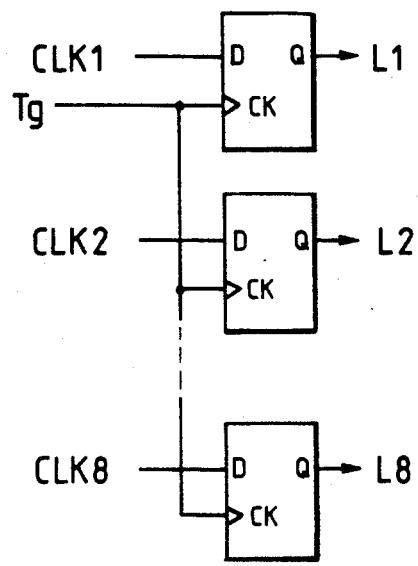
FIG. 22 is a block diagram of an output switch control portion.
FIG. 23 is a table for explaining an operation of an output switch.

In the output switch control portion 208 whose arrangement is shown in FIG. 22 latches the signals CLK1 to CLK8 at the leading edges of the trigger signals Tg, as shown in FIGS. 21 and 22. As a result, a synchronization signal output CLK shown in FIG. 23 is selected by the output switch 207 in accordance with Li (i=1 to 8). The output switch control portion 208 also causes the gate 212 to perform muting during CLK switching.

In this embodiment, the reference current I0 of the triangle wave oscillator 201 is formed by a band-gap voltage, although not shown, thereby preventing oscillation frequency variations caused by variations in power source voltage. The reference voltages VAR to VDR generated by the triangle wave oscillator 201 are correlated with the output VTR from the triangle wave oscillator 201 in terms of voltage and temperature characteristics. Therefore, a nonadjustable system can be obtained.

Figure 29:
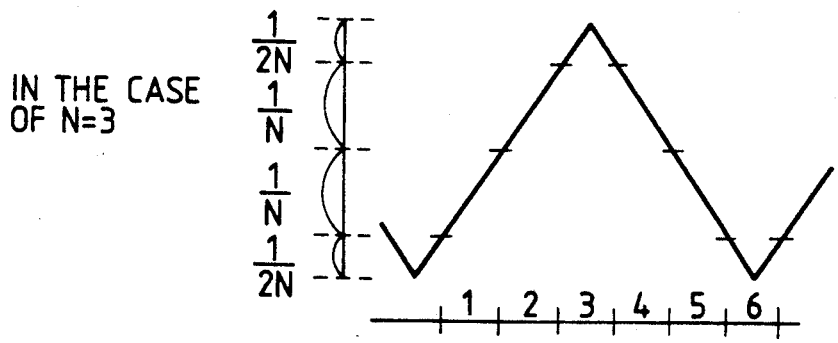
FIG. 29 is a waveform chart showing a triangle wave division.

In this embodiment, the triangle wave is compared with the four levels to form signals CLK1 to CLK8 having eight different phases. In general, signals CLK1 to CLK2N having 2N different phases can be obtained when the triangle wave is compared with N levels. In this case, when the triangle wave amplitude is given as 1, a comparison level of the first point is $\frac{1}{2}N$ from the lower end of the triangle wave, that of the next point is ($\frac{1}{2}N+1/N$), and that of the nth (n ≦N) point is $\frac{1}{2}N+n/N$. A case for N=3 is shown in FIG. 29.

When the trailing edge of the output from the level comparator is matched with the leading edge, signals having eight different phases can be generated from four signals PA to PD each having a positive phase, without using inverted output signals.

Figure 30:
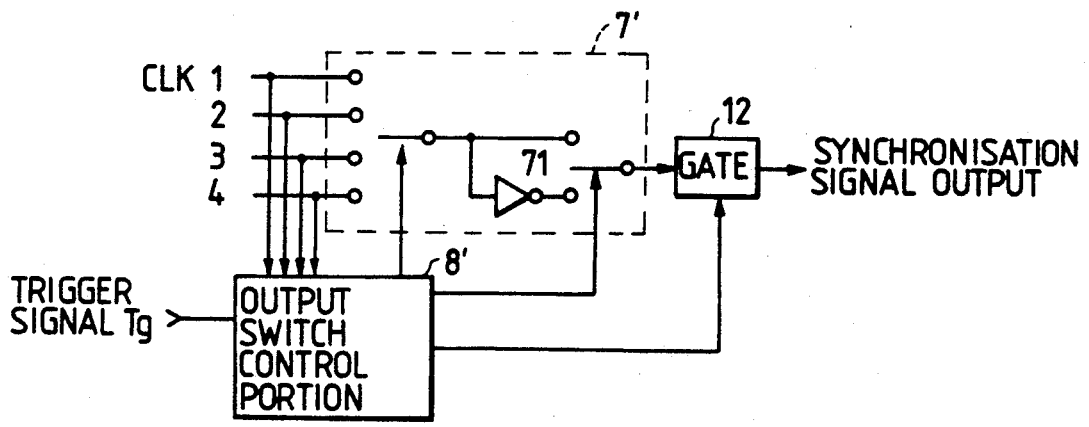
FIG. 30 is a block diagram showing another arrangement of an output switch portion.

As is apparent from FIGS. 21 and 23, the signal CLK5 is an inverted signal of the signal CLK1. Similarly, the signals CLK6 to CLK8 are inverted signals of the signals CLK2 to CLK4. By utilizing this, in detection by an output switch control portion 8′ in FIG. 30, only L1 to L4 are required. When an inversion output portion 71 is arranged in an output switch 7′, the same outputs as in FIG. 21 using signals having eight different phases can be obtained by using the signals CLK1 to CLK4 having four different phases.

Figure 26:
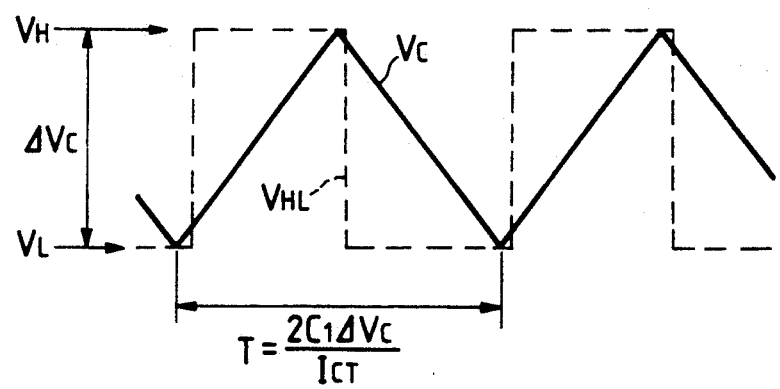
FIG. 26 is a waveform chart of a signal waveform in the triangle wave oscillator shown in FIG. 24.
Figure 31A:
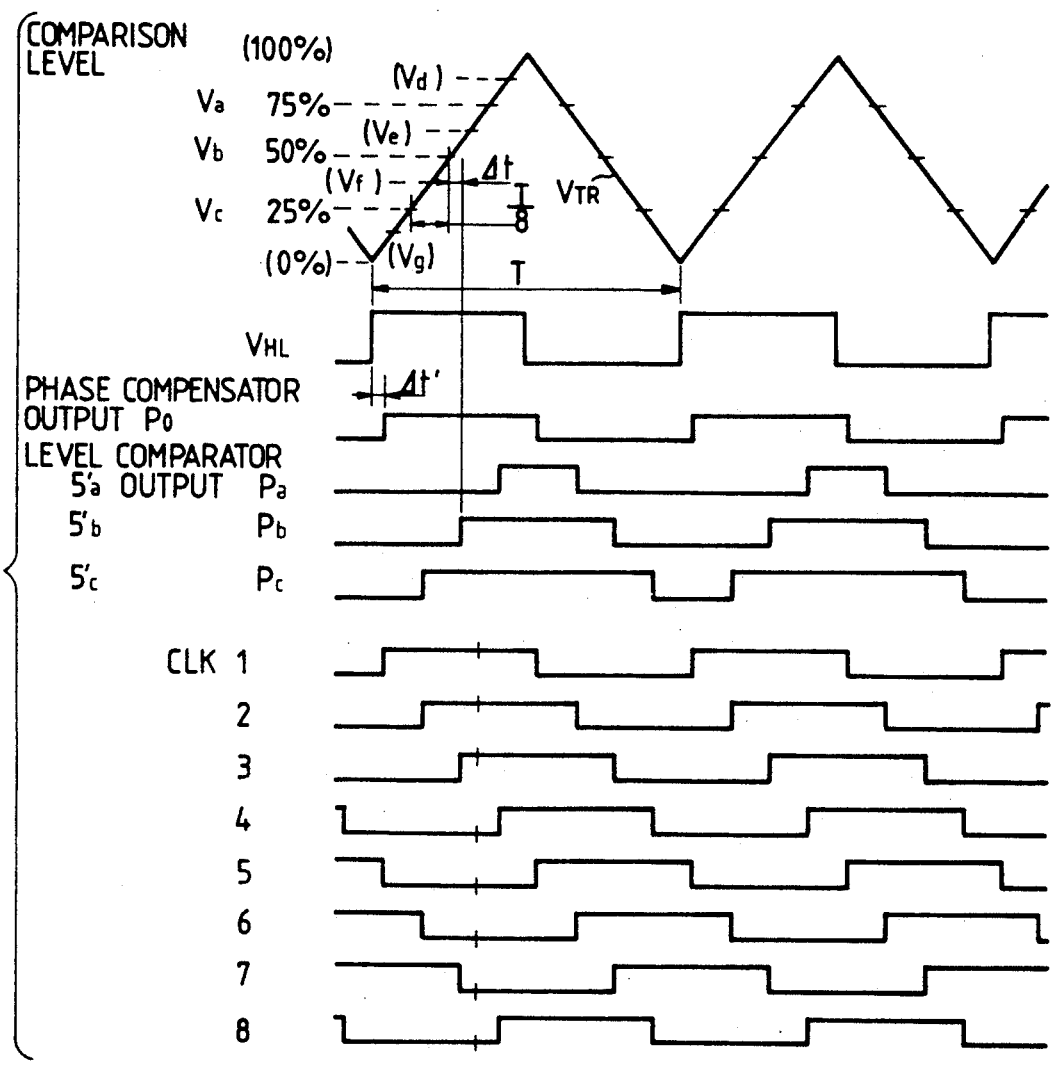
FIGS. 31A and 31B are timing charts showing a relationship between various signals in a modification of the present invention.
Figure 31B:
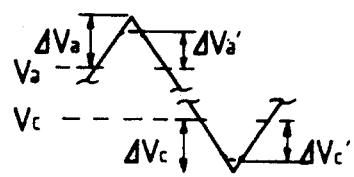
Figure 32:
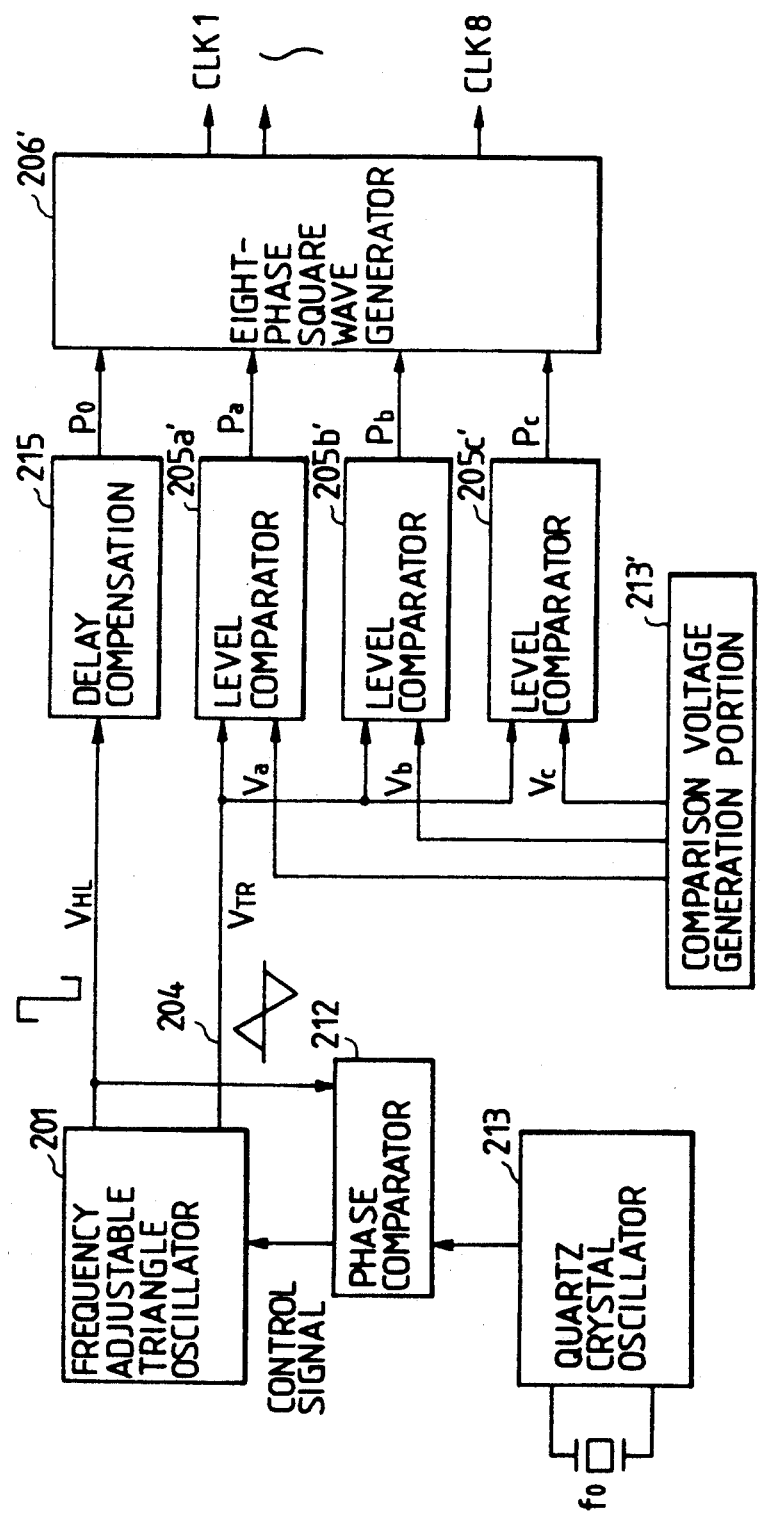
FIG. 32 is a block diagram showing this modification.

As a case for N=4, the limiter comparison voltage VHL has a predetermined phase relationship with the triangle wave signal VTR, as is apparent from FIG. 26. As shown in FIG. 31, level comparison is performed at three points, i.e., Va, Vb, and Vc to obtain signals Pa to Pc. The signal VHL represented by the dotted line in the triangle wave oscillator 201 of FIG. 26, a delay Δt, corresponding to the delay time (represented by Δt in FIG. 31) of each of the level comparators 205a′ to 205c′ is supplied to a delay compensation circuit 215 shown in FIG. 32, thereby obtaining the same outputs CLK1 to CLK8 as in FIG. 21. In this case, in level comparison (Va and Vc in this embodiment) at a point near a vertex of a triangle wave, potential differences ΔVa and ΔVc from the vertex can be doubled from the ΔVAR and ΔVBR as corresponding points in FIG. 21, so that the triangle wave vertex is rounded. Even if the potential differences ΔVa and ΔVc are changed to ΔVa′ and ΔVb′, these potential differences can be detected, thereby accurately performing a comparison/detection operation. If a level comparator having the same detection capacity as in FIG. 21 is used, level intervals can be further reduced, as shown in Va to Vg in FIG. 31. The jitter components can be further reduced (1/16 period in this embodiment).

As described above, the triangle wave signal synchronized with the synchronization clock signal is compared with N levels (N=2, 3, 4, . . . ) The resultant signals are used to obtain signals CLK1 to CLK2N having 2N different phases, and an appropriate CLK signal is selected for the external trigger signal. Without using a frequency signal having a frequency higher than the reference frequency f0, a synchronization clock signal having phase jitter at even a maximum of T/2N can be obtained. Since a quartz crystal oscillator having the same frequency as the desired frequency f0 is used, even if a synchronization signal output has a higher frequency than a conventional frequency, a circuit can be arranged at low cost. In addition, since a frequency higher than the frequency f0 is not used, unnecessary radiation in the high-frequency range can be reduced as compared with a conventional N frequency division scheme. Therefore, influences acting on the peripheral circuits can be reduced.

Fourth Embodiment

In the third embodiment, when the present invention is applied to a resolution adjustable LBP, the fundamental clock frequency is changed to 1.55 MHz at a resolution of 2400 DPI (dots per inch) and 0.69 MHz at a resolution of 600 DPI. For this reason, in the third embodiment, even if the present invention is applied to such an LBP, it is difficult to assure a wide capture range from 1.55 MHz to 9.69 MHz in PLL control. When the present invention is applied to an LBP which can select several resolutions, the arrangement shown in FIG. 21 is required for each resolution.

In addition, even if the clock frequency is fixed to a predetermined value, and when the arrangement in FIG. 21 is formed into an IC, the capture range of ±30% of the free oscillation frequency of the VCO must be covered because an absolute value of a capacitor inside the IC has ±30% variations, thereby widening the capture range. For this reason, PLL stability is degraded, and a jitter amount is undesirably increased.

According to the fourth embodiment of the present invention, since a reference oscillation frequency search function is provided such that the frequency f0 of the reference signal generated from the reference signal generating means such as a quartz crystal oscillator during a blank period from the input of the trigger signal to generation of the synchronization clock signal is set almost equal to the oscillation frequency (to be referred to as a free oscillation frequency hereinafter) of the VCO from/into which an error current flows in open PLL control. Therefore, PLL control can be stably performed without depending on the oscillation frequency of the external reference quartz crystal oscillator. Therefore, a jitter amount corresponding to several different resolutions can be reduced.

Figure 33:
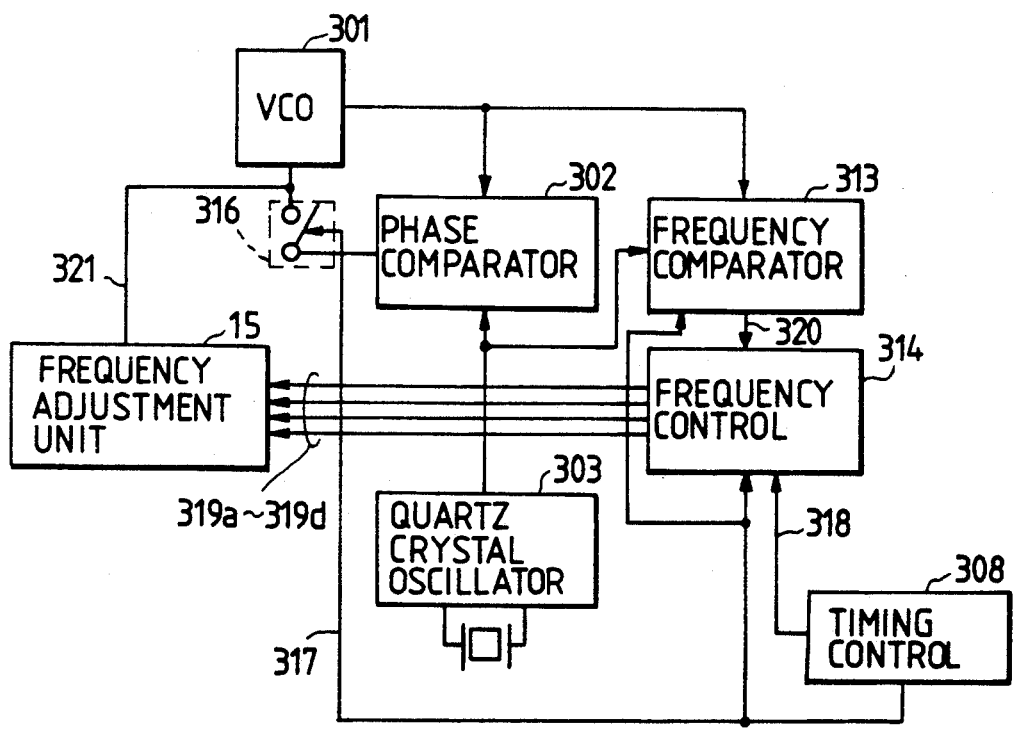
FIG. 33 is a block diagram showing a circuit arrangement of the fourth embodiment of the present invention.

FIG. 33 is a block diagram showing an arrangement of the fourth embodiment of the present invention. Referring to FIG. 33, a VCO 301 outputs a signal having a frequency set by a frequency adjustment unit 315 when a switch 316 is kept off by a control signal 317 (high level) from a timing control portion 308. The VCO 301 causes a phase comparator 3021 and a quartz crystal oscillator 303 to perform PLL control when the switch 316 is kept on, thereby generating a −90° phase signal having a frequency equal to the quartz crystal oscillator output f0. A frequency comparator 313 compares an output from the VCO 301 with an output from the quartz crystal oscillator 303. A frequency control portion 314 controls a control signal supplied to the frequency adjustment unit 315 in accordance with a result from the frequency comparator 313 during the high-level period of the control signal 317 output from the timing control portion 308. When the control signal 317 is kept at low level, the frequency control portion 314 holds an instantaneous trailing edge control state of the control signal 317.

Figure 35:
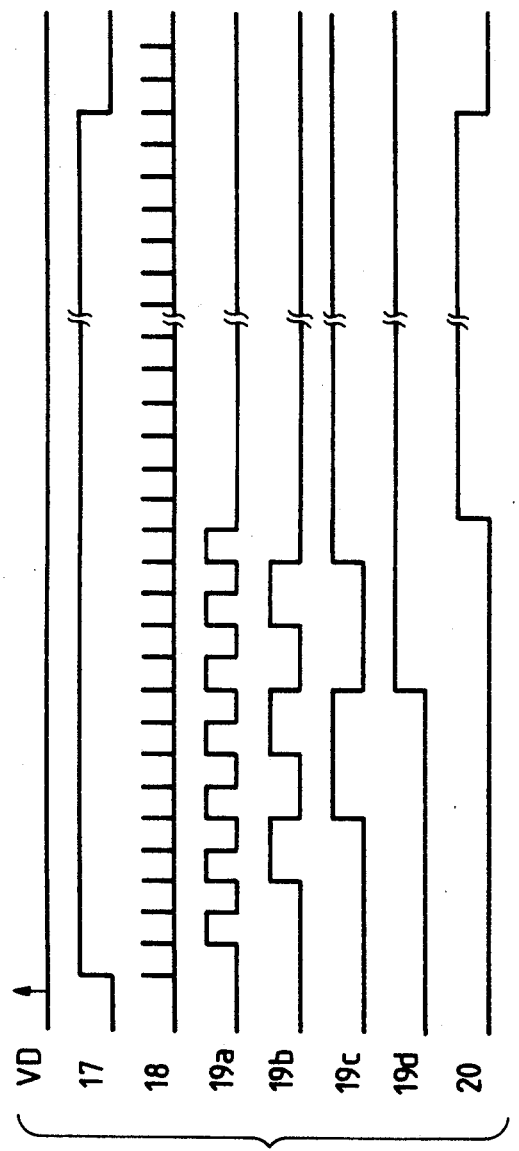
FIG. 35 is a timing chart for explaining an operation of a frequency control portion in FIG. 33.

FIG. 35 is a timing chart of the frequency control portion 314. The frequency control portion 314 is operated when the window of the control signal 317 is kept open (i.e., a high-level period) and outputs, to the frequency adjustment unit 315 as signals 319a to 319d, a signal obtained by counting arbitrary frequency signals 318 output from the timing control portion 308. When an output 320 from the frequency comparator 313 goes to high level, however, the signals 319a to 319d are latched at the leading edge of the next signal 318, and the latched output is output to the frequency adjustment unit 315. The frequency of the control signal 318 is selected so that 16 periods of the control signal 318 are included during the open window state of the control signal 317.

Figure 36:
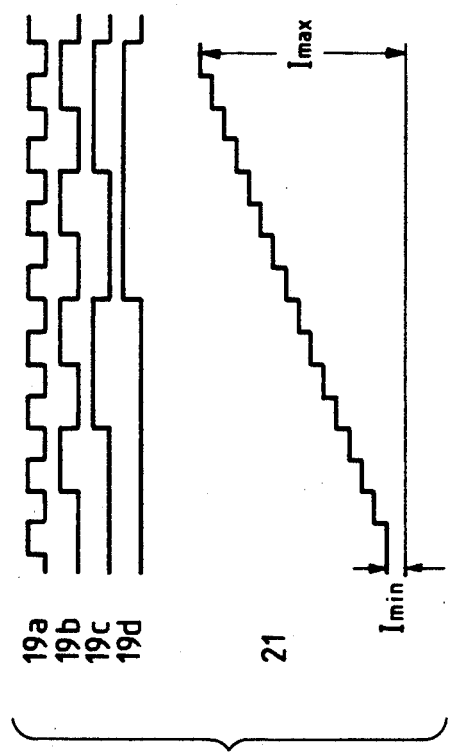
FIG. 36 is a timing chart for explaining an operation of a frequency adjustment unit 315 shown in FIG. 33.

FIG. 36 shows a relationship between the frequency adjustment unit 315 and the frequency control portion outputs 319a to 319d. During the high-level period of the control signal 317, the frequency adjustment unit 315 generates a 16-step output 321 by the control signals 319a to 319d constituting a 4-bit signal. The oscillation frequency of the VCO 301 is changed in proportion to this output signal.

By the operations of the VCO 301, the frequency comparator 313, the frequency control portion 314, and the frequency adjustment unit 315, upon reception of a VD signal, the VCO 301 oscillates at a minimum frequency oscillating in this system. The frequency of the VCO 301 is increased stepwise at timings of the output control signals of the frequency control portion. When the output from the VCO 301 is higher than the output from the quartz crystal oscillator in the frequency comparison portion, the control signals 319a to 319d are latched, and the corresponding frequency serves as the free oscillation frequency.

Thereafter, when the control signal 317 goes to low level, the switch 316 is turned on, so that the frequency control portion continuously latches the control signal 318. The frequency comparator output 320 goes to low level. The arrangement in FIG. 33 is set in PLL control at a point close to the quartz crystal oscillator output by the above operation. The capture range need not be widened exceeding the required range. The arrangement can cope with a wide frequency range. Since the capture range need not be wide, a highly stable synchronization oscillator can be obtained.

Figure 34:
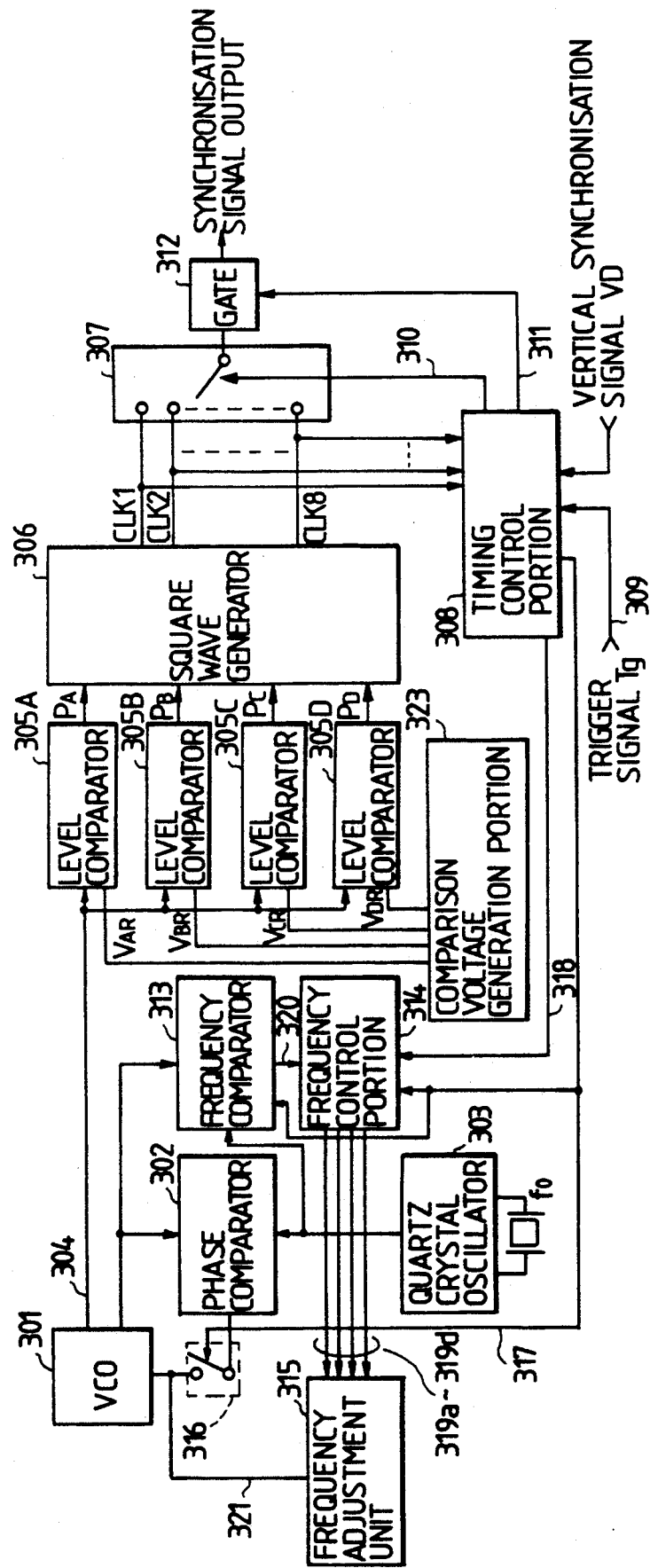
FIG. 34 is a block diagram showing an arrangement obtained when the circuit in FIG. 33 is used to generate an LBP image signal read clock.

FIG. 34 is a block diagram showing an arrangement obtained when the circuit in FIG. 33 is applied to generate an image signal read clock for the LBP. The same reference numerals as in FIG. 20 denote the same parts in FIG. 34, and a detailed description thereof will be omitted. Referring to FIG. 34, a VCO 301 outputs triangle and square wave signals having the same frequency and the same phase. In this embodiment, the above operations are performed simultaneously with the input of a vertical synchronization signal VD. Control during the high-level period of the control signal 317 is performed during the blank period of the upper portion of the drawing. When the control signal 317 goes to low level, a clock signal synchronized with the trigger signal Tg is generated.

When the blank period of the upper portion of the drawing has elapsed, the triangle wave oscillator (to be referred to as a VCO hereinafter) 301 is PLL-controlled by the quartz crystal oscillator (to be referred to as an XO hereinafter) 303 having the frequency f0 serving as a reference frequency and the phase comparator 302. The frequency of the VCO 301 is set equal to that of the XO 303, and the phase of the VCO 301 is kept shifted from the phase of the XO 303 by −90°. A triangle wave output 304 from the VCO 301 is generated by four level comparators 305A to 305D in the comparison voltage generator 313. The triangle wave output 304 is compared with four levels VAR to VDR, and four signals PA to PD are formed. From these signals, a square wave generator 306 generates 50%-duty clock signals CLK1 to CLK8 having eight different phases shifted each other by a ⅛ period.

When the trigger signal Tg input asynchronously from the signals CLK1 to CLK8 is input through an external line 309, the first rising CLK signal upon rising of the trigger signal Tg is selected from the signals CLK1 to CLK8 by an output switch 307 on the basis of a control signal 310 from an output switch control portion 308. At this time, the first period upon a change is fixed to L0 level by a gate 312 by means of a control signal 311 from the output switch control portion 308 so as to allow a reception side to recognize the synchronization signal output.

In this manner, the LBP generates a clock signal for reading a stable image signal highly precisely synchronized with the trigger signal Tg.

When the present invention is applied to an LBP having a plurality of resolutions, only a reference clock signal generating means (e.g., a plurality of quartz crystal oscillators) for oscillating a frequency corresponding to each resolution is arranged.

As described above, according to the fourth embodiment of the present invention, when a clock signal is to be generated by a PLL circuit, the capture range need not be widely assured, and a stable clock signal corresponding to the frequency of the wide-range reference clock signal can be generated.

Fifth Embodiment

The fifth embodiment of the present invention will be described in detail with reference to the accompanying drawings.

Figure 37:
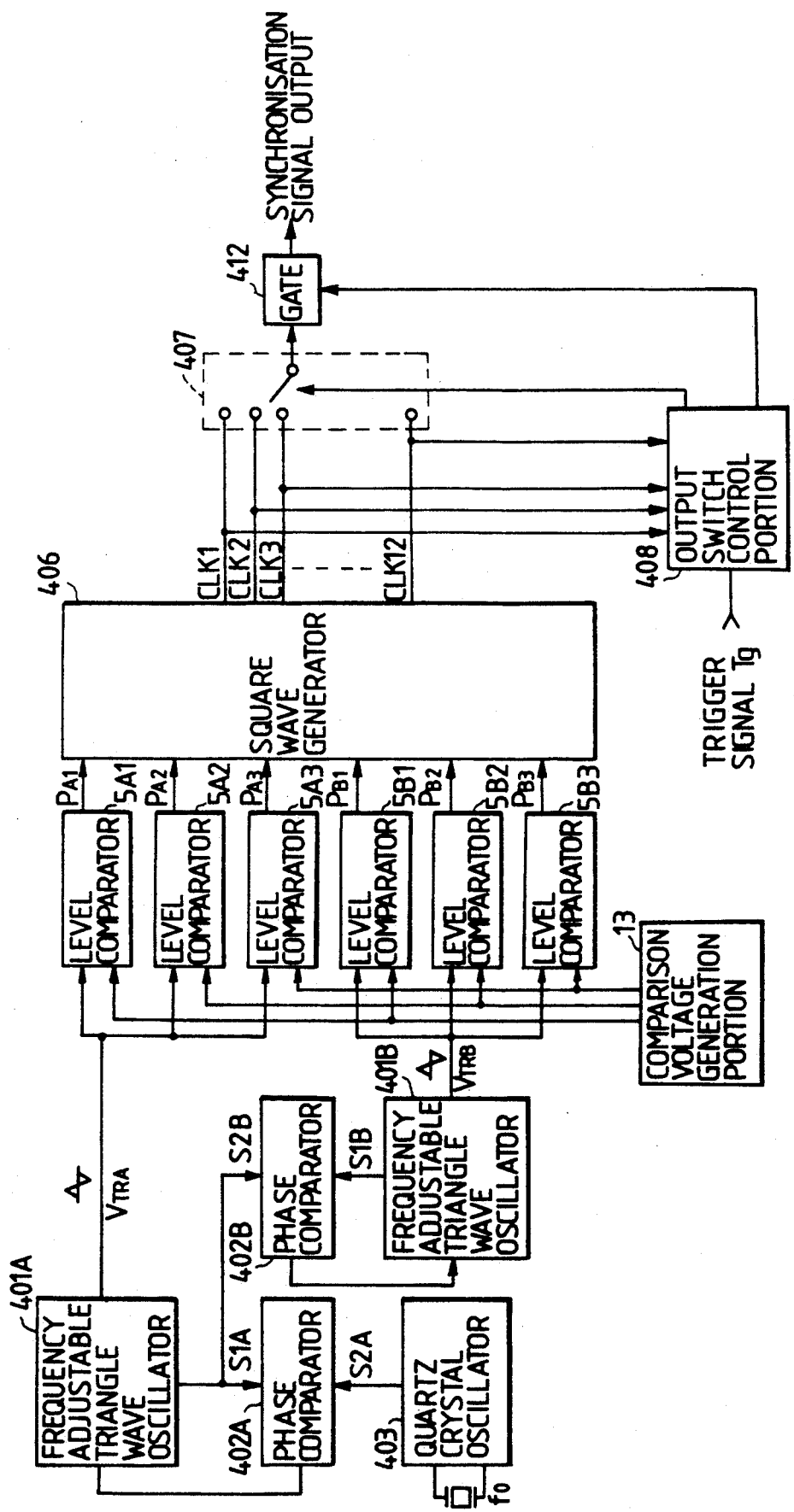
FIG. 37 is a block diagram showing the fifth embodiment of the present invention.
Figure 38:
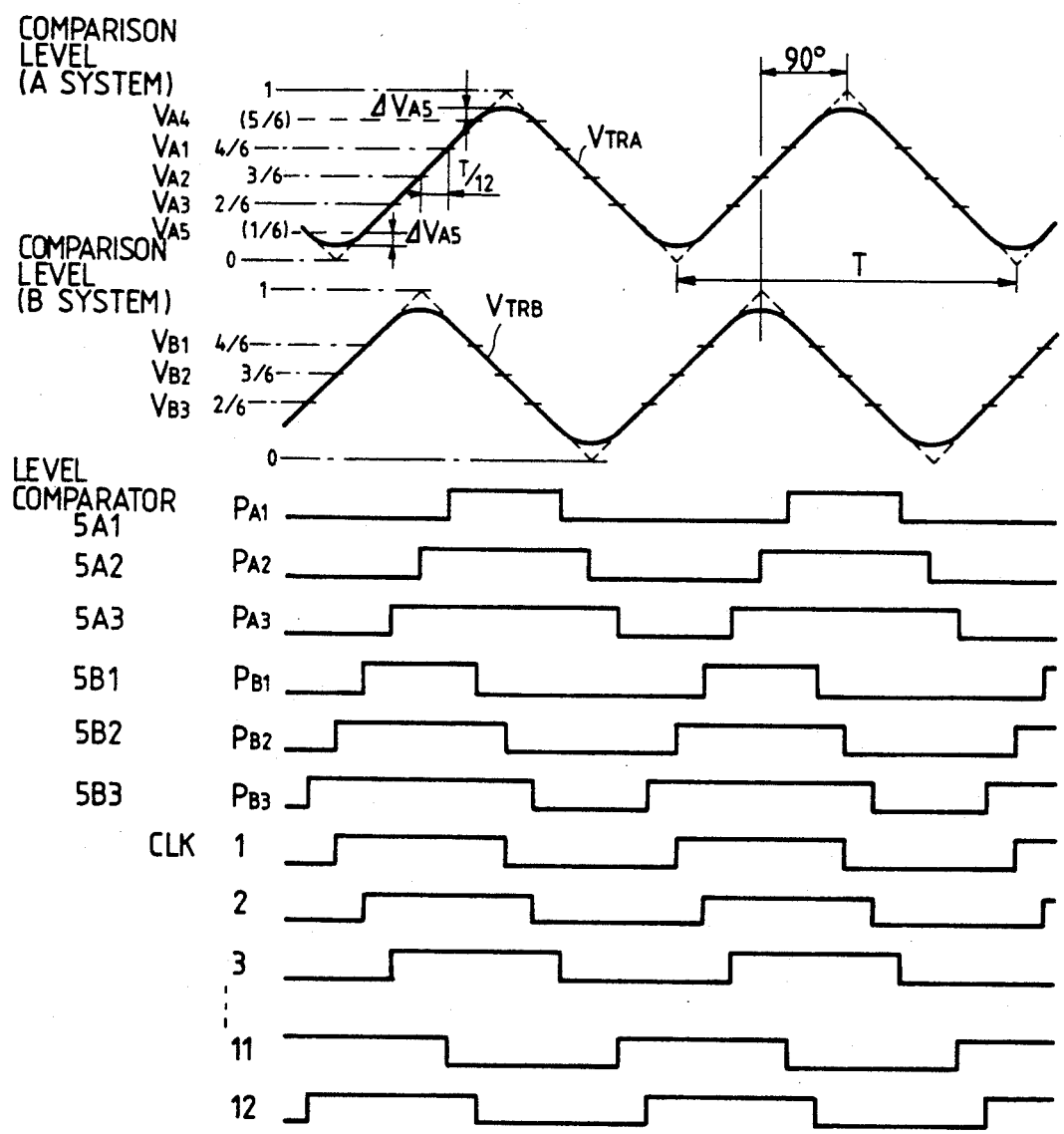
FIG. 38 is a timing chart showing a relationship between various signals in FIG. 37.

FIG. 37 shows the fifth embodiment of the present invention. FIG. 38 shows a relationship between various signals in the embodiment of FIG. 37.

A first frequency adjustable triangle wave voltage-controlled oscillator (to be referred to as a VCO hereinafter) 401A is PLL-controlled by a first phase comparator 402A on the basis of a quartz crystal oscillator 403 in the manner as in the previous embodiments. A phase difference between an output signal from the quartz crystal oscillator 403 and a triangle wave signal VTRA output from the VCO 401A is controlled to be 90°. At the same time, a second frequency variable triangle wave oscillator 401B having the same arrangement as that of the VCO 401A is PLL-controlled by a second phase comparator 402B on the basis of a limiter output from the VCO 401A. A phase difference between the triangle wave signal VTRA output from the VCO 401A and a triangle wave signal VTRB output from the VCO 401B is controlled to be 90°. Each of the VCO 401A and the VCO 401B has the same arrangement as that of the triangle wave oscillator 201 shown in FIGS. 20 and 25. Similarly, each of the phase compactors 402A and 402B has the same arrangement as that of the phase comparator 202 in FIGS. 20 and 27. In this embodiment, in the arrangement of FIG. 27, the phase comparator 402B receives a signal S1 and a limiter output (represented as S1B in FIG. 37) of the VCO 401B as a signal NS1 of the inverted signal of the signal S1. The phase comparator 402B also receives a signal S2 and a limiter output (represented as S2B in FIG. 37) of the VCO 401A as a signal NS2 of the inverted signal of the signal S2.

In the following description, a signal system associated with outputs from the VCO 401A is referred to as an A system, and a signal system associated with outputs from the VCO 401B is referred to as a B system. In this embodiment, the B system triangle wave signal VTRB is stabilized to have a phase shift of 90° (FIG. 38) from the A system triangle wave signal VTRA.

The triangle wave signal VTRA output from the VCO 401A is input to one input terminal of each of three level comparators 5A1 to 5A3. The triangle wave signal VTRB output from the VCO 401B is input to one input terminal of each of level comparators 5B1 to 5B3. Each of comparison voltages VA1 (=VB1), VA2 (=VB2), and VA3 (=VB3) having the levels shown in FIG. 38 is input from a comparison voltage generation portion 413 to the other input terminal of a corresponding one of the level comparators. The respective level comparators generate output signals PA1 to PA3 and PB1 to PB3, as shown in FIG. 38. These output signals are input to a square wave generator 406.

An allowable jitter amount is restricted to T/12 smaller than T/8 described above. When a fundamental clock frequency is set higher than that in the previous embodiments, the vertices of the triangle wave signals VTRA and VTRB are rounded to a degree shown in FIG. 38 by an influence of circuit frequency characteristics.

In this state, when the triangle wave is compared with five levels VA1 to VA5 as previous described, detection is very difficult because potential differences $\Delta$VA4 and $\Delta$A5 between the level VA4 and the vertex of the triangle wave and between the level VA5 and the vertex of the triangle wave are very small. At this time, the B system has a 90° phase difference from the A system, so that a portion corresponding to the A system vertex is the same as a linear portion except for the vertex of the A system triangle wave. As in the A system, results obtained by comparison between the B system triangle wave VTRB and the levels VB1 to VB3 can be used as detection results of the points corresponding to the levels VA4 and VA5 and vertex positions of the A system.

The same is true when the A system is viewed from the B system. Signals PA1 to PA6 shown in FIG. 38 can be obtained by six level comparators 5A1 to 5A3 and 5B1 to 5B3 as a whole. As a result, clock signals CLK1 to CLK12 having 12 different phases shifted each other by T/12 can be formed by a square wave generator 306 on the basis of the six signals PA1 to PB3. An operation for selecting an appropriate CLK signal by an output switch control portion 408 and an output switch 407 is the same as that described in the previous embodiments.

In this embodiment, the signals VTRA and VTRB have identical waveforms and different phases. Common comparison levels in the level comparators can be used in both the A and B systems. The outputs from the comparison voltage generation portion 413 can be shared, as shown in FIG. 37.

Since only the central portions having good linearity, except for the vertex portions of triangle wave signals from the VCOs 401A and 401B are used, a jitter amount can be maintained with a relatively high precision as T/12.

Figure 39:
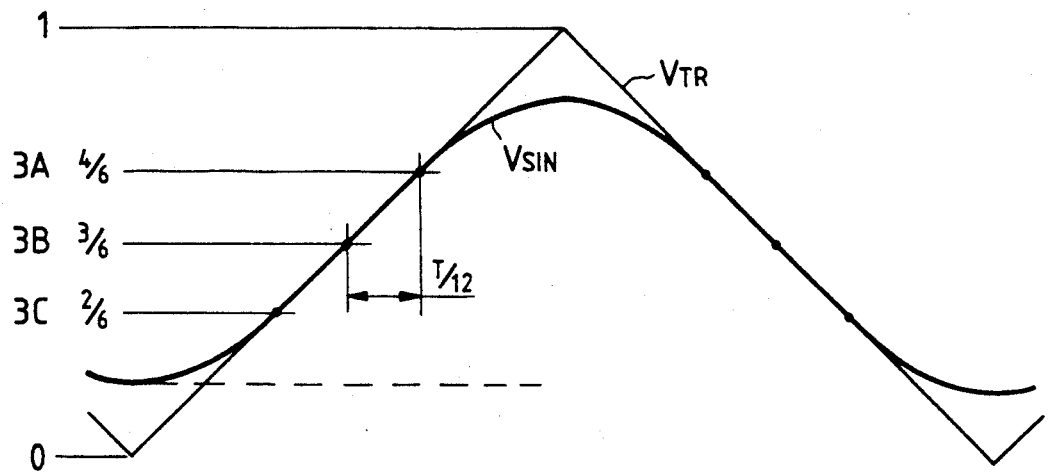
FIG. 39 is a waveform chart for explaining the sixth embodiment of the present invention.

The operations have been described above with reference to the triangle wave signal VTR. However, as previously described, according to the present invention, since only the central portion of the output waveform from the oscillator is used according to the present invention, the waveform need not be a triangle waveform. However, a sinusoidal wave signal may be used to perform approximation, as shown in FIG. 39. When a sinusoidal wave signal VSIN having a relationship with the triangle wave signal VTR is used, level comparison points 3A to 3C are identical to those for the VTR. In addition, since an oscillation waveform can be a sinusoidal wave, an oscillator can be relatively easily arranged. An influence of frequency characteristics can be expected to be reduced as compared with a case wherein a triangle wave is used.

Figure 40:
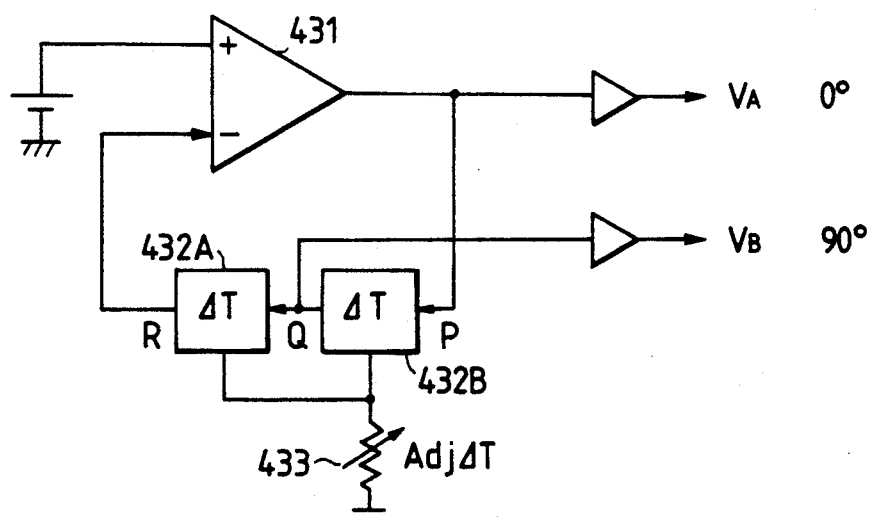
FIG. 40 is a block diagram of a 90° phase difference signal oscillator in the sixth embodiment of the present invention.

The phase comparators are used in the fifth embodiment to maintain a phase difference. However, any other means may be used if a 90° phase difference is maintained, as shown in FIG. 40. An oscillator operated by returning an output P from a differential amplifier 431 to an inverting input R through delay portions 432A and 432B each having a delay amount ΔT is used, and a means 433 for setting the delay amount ΔT of each of the delay portions 432A and 432B variable is arranged. This oscillator is operated so that a phase difference between the output P from the differential amplifier 431 and the inverted input R is a 180° phase difference. At this time, since a sum 2ΔT of the delay amounts of the delay portions 432A and 432B corresponds to the phase of 180°. The delay ΔT is obtained at an intermediate point Q, i.e., a 90° phase difference is obtained with respect to the P point. When PLL control using the quartz crystal oscillator as a reference oscillator by adjusting the adjusting means 433 is performed, a signal VA can be obtained on the 0° side, and a signal VB is output on the 90° side. The same result as in use of the triangle wave signal can be performed by using the signals VA and VB. In this arrangement, only one oscillator is advantageously required.

In the above embodiment, the allowable jitter amount is T/12, i.e., one period of the fundamental clock is divided into 12 segments. However, a division count is not limited to 12, but may be increased in accordance with required specifications and circuit characteristics.

In addition, a phase difference between the two triangle wave signals or the like can be +90° or −90°. If the phase difference is kept constant, the same effect can be obtained.

According to the fifth embodiment of the present invention, as has been described above, when the number of comparison levels is increased to reduce a synchronization jitter amount, or even if the frequency of a desired synchronization clock signal output is high, a stable synchronization clock signal can be obtained.

Sixth Embodiment

Figure 41:
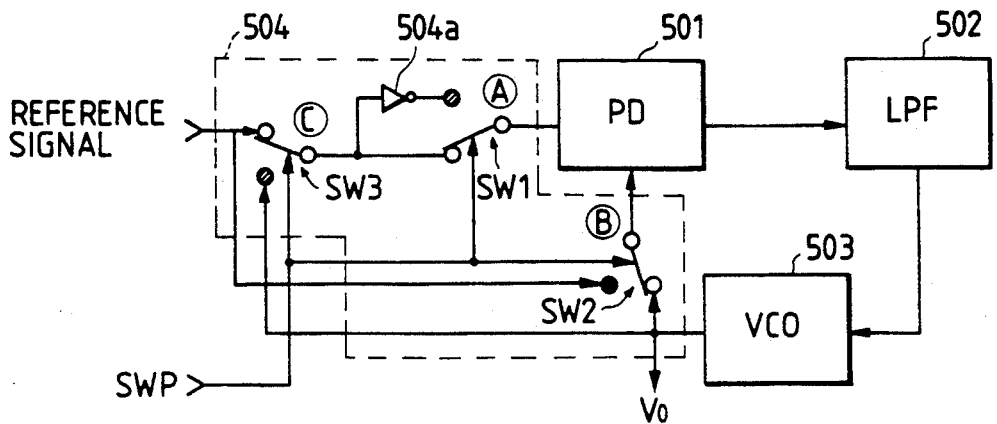
FIG. 41 is a block diagram of the seventh embodiment of the present invention.

FIG. 41 is a block diagram best showing the characteristic feature of the present invention. This arrangement includes a phase comparator (PD) 501 for detecting a phase difference between signals input to the A and B terminals, a low-pass filter (LPF) 502 for smoothing a phase error voltage output from the phase comparator 501, a voltage-controlled oscillator (VCO) 503 whose oscillation frequency is changed in accordance with the phase error voltage smoothed by the LPF 502, and a switch circuit 504 for switching the signals input to the A and B terminals of the phase comparator 501 on the basis of a switching signal SWP. The switch circuit 504 has three switches SW1, SW2, and SW3, and an inverter 504a (an operation of the switch circuit 504 will be described later).

Figure 42:
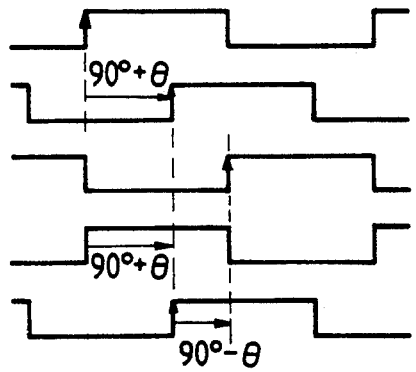
FIGS. 42(1) to 42(5) are timing charts for explaining an operation of the seventh embodiment.

FIGS. 42(1) to 42(5) are timing charts showing an operation of the circuit having the above arrangement. FIGS. 42(1) and 42(2) show a reference signal input to the A terminal and an output supplied from the VCO 503 to the B terminal (the switches SW1 to SW3 are as illustrated in FIG. 41). In FIGS. 42(1) and 42(2), the output from the VCO 503 is synchronized with the reference signal at a phase of 90°+θ due to the cause such as circuit element variations. In this state, when the switches SW1 to SW3 in the switch circuit 504 are operated to input the reference signal to the B terminal and the inverted signal of the signal from the VCO 503 to the A terminal, the B terminal of the phase comparator 501 is synchronized with the B terminal at a phase of 90°+θ. In this case, the reference signal is synchronized with the inverted signal of the signal output from the VCO 503 at a phase of 90°+θ. When this is represented by a phase relationship between the reference signal and the VCO output, the VCO output is synchronized with the reference signal at a phase of 90°−θ (FIGS. 42(3), 42(4), and 42(5)). Therefore, the locked-phase is changed to 90°±θ every switching.

Figure 43:
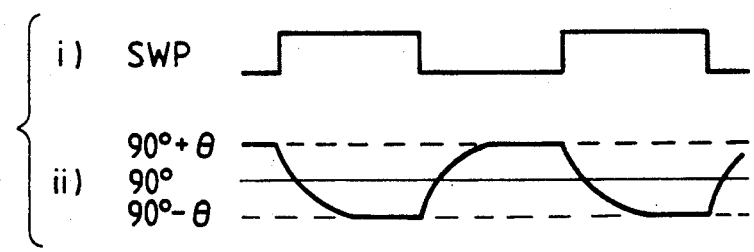

FIGS. 43(i) and 43(ii) show the phase of the output from the VCO 503 with respect to the reference signal during switching of the input signal to the phase comparator 501 in accordance with the switching signal SWP. When the input signals to the A and B terminals are switched by the signal SWP in FIG. 43(i), the phase of the output from the VCO 503 is alternately changed between 90°+θ and 90°−θ with respect to the phase of the reference signal, as shown in FIG. 43(ii) in accordance with a response speed of a feedback loop of PD 501→LPF 502→VCO 503→PD 501.

By fixing the switching signal SWP to a predetermined period and increasing a feedback loop time constant, the locked-phase of the output from the VCO 503 with respect to the reference signal can be stabilized to an average value between the phases of 90°+θ and 90°−θ, i.e., to the phase of 90°.

As described above, according to the sixth embodiment of the present invention, a phase error except for an initial phase error between the input signals caused by variations in circuit element variations can be reduced, and high-precision phase difference signal can be obtained.

What is claimed is:

1. A phase-locked signal generator for generating a clock signal phase-locked with an external input trigger signal, comprising:
   means for generating a period signal having a frequency equal to that of a clock signal to be output;
   means for comparing the period signal with a plurality of reference levels different from each other, and for outputting comparison results;
   memory means for storing the comparison results from said comparing means in synchronism with an input of the trigger signal; and
   means for outputting the clock signal phase-locked with the trigger signal on the basis of the comparison results stored in memory means.

2. A generator according to claim 1, wherein said period signal generating means generates a triangle wave signal as the period signal.

3. A generator according to claim 1, wherein said period signal generating means also generates a square wave signal synchronized with the period signal, and wherein said outputting means outputs the clock signal phase-locked with the trigger signal on the basis of the comparison results stored in said memory means, the comparison results from the comparing means and the square wave signal.

4. A generator according to claim 1, wherein said outputting means comprises:
   a first logical circuit for outputting a first signal defining a leading edge of the clock signal to be output in response to the stored comparison results;
   a second logical circuit for outputting a second signal defining a trailing edge of the clock signal to be output; and
   an RS-flip-flop circuit that sets and resets in response to the first and second signals so as to output the clock signal phase-locked with the trigger signal.

5. A generator according to claim 1, wherein said comparing means comprises:

one or more first comparing units each for comparing the period signal with one of the plurality of the reference levels to output a binary signal as the comparison result; and a charge pump circuit for performing charge and discharge operations on the basis of the binary signal output from said first comparing unit, wherein the reference level supplied to at least one first comparing unit is changed in accordance with an output voltage of said charge pump circuit.

6. A generator according to claim 5, further comprising an inverter for inverting the output voltage from said charge pump circuit, wherein the reference level supplied to at least one of said first comparing units is changed in accordance with the output voltage of said inverter.

7. A generator according to claim 5, wherein said comparing means further comprises:

one or more second comparing units each for comparing the period signal with one of the reference levels and outputting a binary signal, and wherein each reference level supplied to said one or more second comparing units is changed in response to the output voltage from said charge pump circuit charged and discharged on the basis of the binary signal output from said first comparing means.

8. A generator according to claim 1, wherein said period signal generating means comprises:

frequency adjustable oscillating means for variably adjusting a frequency of a period signal output in response to a first or a second control signal;

reference clock signal generating means for generating a reference clock signal;

phase comparing means for comparing a phase of the period signal output from said frequency adjustable oscillating means with a phase of the reference clock signal and outputting the first control signal; and frequency comparing means for comparing the frequency of the period signal from said frequency adjustable oscillating means with a frequency of the reference clock signal and outputting the second control signal.

9. A generator according to claim 8, wherein said frequency comparing means comprises a memory for storing the comparison result, and wherein said period signal generating means has a first mode for controlling the frequency of said frequency adjustable oscillating means in accordance with the second control signal output from said frequency comparing means on the basis of the first control signal and a content of said memory, and a second mode for controlling the frequency of the period signal output from said frequency adjustable oscillating means in response to the second control signal output from said control signal generating means on the basis of the comparison result from said frequency comparing means.

10. A generator according to claim 9, wherein said frequency adjustable oscillating means outputs a triangle and/or square wave signal as the period signal.

11. A phase-locked signal generator for generating a clock signal phase-locked with an external input trigger signal, comprising:

first period signal generating means for generating a first period signal, the first period signal being an analog signal and a frequency of the first period signal being equal to that of a clock signal to be output;

first comparing means for comparing the first period signal output from said first period signal generating means with a plurality of reference levels to produce a comparison result;

first clock signal output means for outputting a plurality of clock signals having phases different from each other on the basis of said comparison result from said first comparing means; and means for selectively outputting, in response to an input timing of an external trigger signal, one of the plurality of clock signals output from said first clock signal output means.

12. A generator according to claim 11, further comprising:

second period signal generating means for generating a second period signal having a phase shifted from that of the first period signal by 90°;

second comparing means for comparing the second period signal output from said second period signal generating means with a plurality of reference levels to produce a second comparison result; and second clock signal output means for outputting a plurality of clock signals having phases different from each other on the basis of said second comparison result from said second comparing means, and wherein said selecting means selects and outputs one of the plurality of clock signals output from said first clock signal output means and the plurality of clock signals output from said second clock signal output means in response to an input timing of the trigger signal.

13. A generator according to claim 11, wherein said first period signal generating means generates a triangle wave signal as the first period signal.

14. A generator according to claim 11, further comprising means for compensating a delay time in said first comparing means.

15. A generator according to claim 11, wherein said first comparing means comprises:

first comparing unit for comparing the period signal with one of the plurality of reference levels to output a binary signal as the comparison result; and a charge pump circuit for performing charge and discharge operations on the basis of the binary signal output from said first comparing unit, wherein the reference level supplied to said first comparing unit is changed in accordance with an output voltage of said charge pump circuit.

16. A generator according to claim 15, wherein said first comparing means further comprises:

second comparing unit for comparing the period signal with one of the reference levels and outputting a binary signal, and wherein each reference level supplied to said one or more second comparing units is changed in response to the output voltage from said charge pump circuit charged and discharged on the basis of the binary signal output from said first comparing means.

17. A generator according to claim 11, wherein said first period signal generating means comprises:

frequency adjustable oscillating means for variably adjusting a frequency of a period signal output in response to a first or a second control signal;

reference clock signal generating means for generating a reference clock signal;

phase comparing means for comparing a phase of the period signal output from said frequency adjustable oscillating means with a phase of the reference clock signal and outputting the first control signal; and frequency comparing means for comparing the frequency of the period signal from said frequency adjustable oscillating means with a frequency of the reference clock signal and outputting the second control signal.

18. A generator according to claim 17, wherein said frequency comparing means comprises a memory for storing the comparison result, and wherein said period signal generating means has a first mode for controlling the frequency of said frequency adjustable oscillating means in accordance with the second control signal output from said frequency comparing means on the basis of the first control signal and a content of said memory, and a second mode for controlling the frequency of the period signal output from said frequency adjustable oscillating means in response to the second control signal output from said control signal generating means on the basis of the comparison result from said frequency comparing means.

19. A generator according to claim 18, wherein said frequency adjustable oscillating means outputs a triangle and/or square wave signal as the period signal.

* * * * *

UNITED STATES PATENT AND TRADEMARK OFFICE
CERTIFICATE OF CORRECTION

PATENT NO. : 5,220,201
DATED : June 15, 1993
INVENTOR(S) : SOMEI KAWASAKI, ET AL. Page 1 of 2

It is certified that error appears in the above-identified patent and that said Letters Patent is hereby corrected as shown below:

On the title page:

IN [30] FOREIGN APPLICATION PRIORITY DATA

"Jun. 26, 1990 [JP] Japan .......... 20165615" should read
--Jun. 26, 1990 [JP] Japan .......... 2-165615--.

COLUMN 10

Line 34, "form" should read --from--.

COLUMN 11

Line 13, "he" should read --the--.

COLUMN 18

Line 13, "previous" should read --previously--.

COLUMN 20

Line 43, "memory" should read --said memory--.

UNITED STATES PATENT AND TRADEMARK OFFICE
CERTIFICATE OF CORRECTION

PATENT NO. : 5,220,201

DATED : June 15, 1993

INVENTOR(S) : SOMEI KAWASAKI, ET AL.

Page 2 of 2

It is certified that error appears in the above-identified patent and that said Letters Patent is hereby corrected as shown below:

<u>COLUMN 24</u>

Line 13, "claim 18," should read --claim 17,--.

Signed and Sealed this

Fifth Day of April, 1994

Attest:

BRUCE LEHMAN

*Attesting Officer*    *Commissioner of Patents and Trademarks*